United States Patent
Ota

(10) Patent No.: US 6,388,735 B1
(45) Date of Patent: *May 14, 2002

(54) PROJECTION EXPOSURE SYSTEM

(75) Inventor: Kazuya Ota, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/671,741

(22) Filed: Sep. 29, 2000

Related U.S. Application Data

(62) Division of application No. 09/272,568, filed on Mar. 19, 1999, now Pat. No. 6,236,448, which is a division of application No. 08/434,987, filed on May 4, 1995, now Pat. No. 6,018,384.

(30) Foreign Application Priority Data

Sep. 7, 1994 (JP) .............................. 6-213669
Sep. 8, 1994 (JP) .............................. 6-214490

(51) Int. Cl.$^7$ .......................... G03B 27/42; G03B 27/53
(52) U.S. Cl. .......................... 355/53; 356/400; 356/401
(58) Field of Search .............................. 355/53, 55, 67; 356/399, 400, 401; 430/5, 22, 30; 250/548

(56) References Cited

U.S. PATENT DOCUMENTS

| 4,629,313 A | 12/1986 | Tanimoto | 355/53 |
| 5,214,489 A | 5/1993 | Mizutani et al. | 356/363 |
| 5,406,373 A | 4/1995 | Kamon | 356/401 |
| 5,408,320 A | 4/1995 | Katagiri et al. | 356/363 |
| 5,414,514 A | 5/1995 | Smith et al. | 356/363 |
| 5,506,684 A | 4/1996 | Ota et al. | 356/401 |
| 5,528,027 A | 6/1996 | Mizutani | 250/234 |
| 5,646,413 A | 7/1997 | Nishi | 356/401 |
| 5,661,546 A | 8/1997 | Taniguchi | 355/53 |
| 6,018,384 A | * 1/2000 | Ota | 355/53 |
| 6,236,448 B1 | * 5/2001 | Ota | 355/53 |
| 6,249,336 B1 | * 6/2001 | Ota | 355/53 |

FOREIGN PATENT DOCUMENTS

| JP | 4629313 | 12/1986 |
| JP | 62-200724 | 9/1987 |

* cited by examiner

Primary Examiner—Alan A. Mathews
(74) Attorney, Agent, or Firm—Oliff & Berridge PLC

(57) ABSTRACT

A projection exposure system for printing the pattern formed on a reticle onto a wafer includes a reticle stage (5) and a wafer stage. A first reference plate (9) having a first reference pattern (MM1) formed thereon is mounted on the reticle stage (5), and a second reference plate (25) having a second reference pattern (WM1) formed thereon is mounted on the wafer stage. The first reference pattern (MM1) comprises two cross-marks (60a, 60b) spaced apart from each other in X-direction, and the second reference pattern (WM1) comprises two cross-marks (61a, 61b) spaced apart from each other in X-direction. Images of the cross-marks (61a, 61b) of the second reference pattern (WM1) are formed through a projection optical system (2) on the reticle stage (5) and superimposed with the cross-marks (60a, 60b) of the first reference pattern (MM1). A pair of observation optical systems (10, 11) spaced apart from each other in X-direction are used to observe the superimposed images of the corresponding cross-marks (60a and 61a, 60b and 61b), so as to determine the position shifts in X-direction between the corresponding superimposed images at two positions spaced from each other in X-direction. The determined position shifts are used to calculate the variation in projection magnification. The projection exposure system is capable of quick and high precision detection of the magnification of the projection optical system (2).

21 Claims, 10 Drawing Sheets

PROJECTION EXPOSURE SYSTEM

This application is a division of prior application Ser. No. 09/272,568 filed Mar. 19, 1999, now U.S. Pat. No. 6,236,448, which is a division of prior application Ser. No. 08/434,987 filed May 4, 1995, now U.S. Pat. No. 6,018,384.

BACKGROUND OF THE INVENTION

The present invention relates to a projection exposure system used for accomplishing the lithographic processes for manufacturing, for example, semiconductor integrated circuits, liquid crystal display devices, etc., and particularly to such a projection exposure system with a mechanism for efficiently detecting and correcting magnification and other factors of a projection optical system used in the projection exposure system. The present invention is also applicable to a step-and-scan type of scanning projection exposure system in which patterns of a mask are projected for exposure onto one shot-field after another on a photosensitive substrate after each shot-field is moved to a scanning starting position in a stepping fashion.

RELATED BACKGROUND ART

In the art of the projection exposure systems used for accomplishing the lithographic processes for manufacturing, for example, semiconductor integrated circuits, liquid crystal display devices, etc., it is desired to keep constant at all times the image formation characteristics of a projection optical system used in the projection exposure system with high accuracy in order to ensure that the fine patterns of a reticle (or a photomask) can be projected onto a resist-coated wafer (or a glass plate, etc.) with high resolution, and/or that the patterns of a reticle can be projected onto the wafer while the next patterns in sequence will be aligned on the previous patterns formed on the wafer with precise registration.

However, it is often impossible to keep constant the image formation characteristics of the projection optical system, due to the changes in the environmental factors of the projection optical system such as the atmospheric pressure and temperature, the changes in the shapes of the projection image of the patterns of the reticle and/or the projection optical system which may be induced by the heat generated by the absorption of the illumination light, or the changes in the shapes of the patterns on the reticle which may be induced when so-called phase-shift masks are used. On the other hand, in recent years, various illumination methods have been devised in order to satisfy the strict requirements for the finer patterns of semiconductor devices and the like. For example, there have been proposed illumination methods including Annular Illumination method (Japanese published patent application No. Sho-61-91662) in which reticle patterns are illuminated with an illumination light beam which has an annular light intensity distribution defined in the pupil plane or in a plane near the pupil plane of the illumination optical system, and Modified Light Source method or Oblique Incidence Illumination method (Japanese published patent application Nos. Hei-4-101148 and Hei-4-408096) in which reticle patterns are illuminated with an illumination light beam incident on the reticle obliquely at a predetermined angle relative to the surface of the recticle, and in which the illumination light beam has a light intensity distribution in the pupil plane or in a plane near the pupil plane of the illumination optical system so defined that at least one maximum is present at a point eccentric from the optical axis of the illumination optical system a predetermined distance. When an illumination method used in a projection exposure system is changed from a conventional one to Annular Illumination method or Modified Light Source method, the image formation characteristics often change due to a change in the illumination conditions.

In an attempt to overcome these problems, there have been proposed and practiced various methods of correcting image formation characteristics. Several methods are proposed particularly for making corrections for the variations in the image formation characteristics of the projection optical system which are induced by the absorption of the exposure light energy. For example, U.S. Pat. No. 4,666,273 proposes one of such methods, in which the energy (heat) which is accumulated in the projection optical system when it is illuminated with the exposure light beam (for example, a light beam emitted from a KrF excimer laser having I-line spectrum) is continuously calculated, the change in the image formation characteristics to be induced by the accumulated energy is predicted, and fine adjustment of the image formation characteristics is performed through a certain correction mechanism.

The projection magnification, which is one of the basic characteristics of the projection optical system, tends to change due to, for example, the heat generated by the illumination with the exposure light beam and the changes in the atmospheric pressure and other factors, as described. In an attempt to make the variations in the magnification ratio as small as possible, various techniques have been practiced including one in which spaces between the lenses within the projection optical system are hermetically sealed and the pressures in the spaces are adjusted, and one in which some of the lenses of the projection optical system are moved along the optical axis for adjustment.

In recent years, with the advance in scaling down patterns of semiconductor integrated circuits and the like, the importance of the variations in distortion (including so-called pin-cushion distortion and barrel-form distortion) of the projection optical system have increased. Thus, there have been proposed mechanisms for making corrections for the variations in the distortion, including one for moving the reticle along the optical axis of the projection optical system, one for moving some of the lenses of the projection optical system along its optical axis, and one for changing the wavelength of the light emitted from the exposure light source (such as a laser).

More recently, there have been proposed various scanning projection exposure systems (step-and-scan projection exposure systems) in which both the reticle and the wafer are moved relative to the projection optical system for scanning, so as to meet the needs for exposing a larger area with constant image formation characteristics.

A prototype of such scanning projection exposure systems is a "reflection projection aligner", in which a reflecting projection optical system with the magnification 1:1 (equal ratio) is used, a reticle stage for holding an equal ratio reticle (or "mask" in its narrower definition) and a wafer stage for holding a wafer are fixedly connected to a common moving column, and the reticle and the wafer are moved as an integral unit and thus at the same velocity for scanning exposure. The equal ratio reflecting projection optical system has no refracting element and is never subject to a chromatic aberration in a wide wavelength range of the exposure light. Thus, more than one line spectra from a light source (for example, G-line and H-line spectra from a mercury vapor lamp) can be used simultaneously so as to enhance the exposure intensity, thereby enabling a high speed scanning exposure. The reflecting projection optical system has the point where both the astigmatism in the sagittal plane and that in the meridional plane are to be zero, the location of which point is however limited to be within a region near a certain image height position distant from the optical axis of the reflecting projection optical system a certain distance, and thus, the shape of the exposure light beam is defined to be a portion of a narrow annular ring, that is, so-called arc-slit-shaped.

In the equal ratio scanning projection exposure systems with equal ratio reflecting projection optical system, two types of projection optical systems may be used; one projects onto the wafer such image of the reticle patterns that is not a mirror image of the actual reticle patterns, and the other projects onto the wafer such image of the reticle patterns that is a mirror image of the actual reticle patterns. When the former type of projection optical system is used, the reticle and the wafer are fixedly held on one moving column and in alignment with each other, and the moving column is moved linearly in the direction transverse to the longitudinal direction of the arc-slit-shaped illumination area for scanning. When the latter type of projection optical system is used, separate reticle stage and wafer stage are required and moved in opposite directions at the same velocity.

There is also known another type of scanning projection exposure techniques in which a projection optical system having refracting elements and of the magnification not 1:1 (equal ratio) is used, and the reticle stage and the wafer stage are moved for scanning at velocities which are in ratio equal to the magnification. This type of scanning projection exposure system may include a projection optical system using both reflecting refracting elements, or alternatively, a projection optical system using refracting elements only. Japanese published patent application No. Sho-63-163319 discloses a magnification projection optical system using both reflecting and refracting elements.

In this technique, the maximum effective diameter of the exposure field can be utilized by illuminating the reticle with a slit-shaped illumination light beam. Further, exposure field may be advantageously extended in the scanning direction without any limitation imposed from the construction of the projection optical system. Moreover, high uniformity in the illumination and high accuracy with respect to the distortion may be relatively easily achieved because only a part of the field of the projection optical system is utilized.

Any and all of these projection exposure techniques require some method of effectively predicting or detecting the variations in the magnification and or the distortion of the projection optical system. There have been proposed two types of such methods; indirect detection method and direct detection method. In an indirect detection method, the illumination energy irradiated onto the projection optical system is measured by an illumination sensor and/or any variations in the atmospheric pressure are measured by an atmospheric pressure sensor, and then the measurements are used to predict an appropriate amount of correction. In a direct detection method, the variations in the projection magnification and/or the distortion of the projection optical system are directly measured by means of a suitable measuring technique. In one example of such measuring technique, the relative position shift between a first position mark formed on the reticle and a second position mark formed on the wafer or on any other member equivalent to the wafer for the purpose is measured, and the measurement is used to estimate the projection magnification.

However, in any of the existing projection exposure systems, when an indirect detection method is used, a substantial error tends to occur because of the individual difference of the projection optical systems in the characteristics based on which correction amount is calculated. In order to avoid such error, the characteristics of the projection optical systems of all the projection exposure systems must have been previously measured, which is however very time-consuming.

Further, with the advance of the scale down of the patterns of the semiconductor integrated circuits and the like, such projection exposure systems have been designed that are capable of selecting one from a plurality of illumination methods including Annular illumination method and Modified Light Source method. The selection can be switched form one to another depending on patterns to be transferred onto the wafer. However, the characteristics of the projection optical system is affected by the switching of the illumination method. Therefore, this method tends to increase the error in the image formation characteristics and more time is required to measure the image forming characteristics.

On the other hand, when a direct detection method is used, a reference mask must be mounted or demounted from the projection exposure system every time the measurement is made. The work of mounting and demounting of the reference mask as well as the care of the reference mask are time-consuming, and further, each time the reference mask is mounted on the projection exposure system, there must be some variation present in the positioning of the reference mask, which leads to image formation errors.

Moreover, in any of the existing detection method, a reticle having a positioning marks formed thereon for measurement (i.e., a reference mask) must be mounted and demounted on and from the projection exposure system every time the measurement is made. The work of mounting and demounting the reference mask as well as the care of the reference mask are troublesome, and further, each time the mask is mounted on the projection exposure system, there must be some variation present in the positioning of the reference mask, which leads to measurement errors.

Although the scanning projection exposure systems have a specific feature that the reticle and the wafer are separately moved for scanning, any and all the existing detection methods are suited only for the projection exposure technique in which the reticle and the wafer are moved together as an integral unit for scanning. Thus, a detection method suitable for the scanning projection exposure systems are highly desired.

SUMMARY OF THE INVENTION

It is an object of the present invention to provide a projection exposure system which is capable of quick and high precision measurement of the variations in the magnification, the distortion and other factors of the projection optical system used therein.

It is another object of the present invention to provide a scanning projection exposure system which is capable of quick and high precision measurement of the variations in the magnification, the distortion and other factors or the projection optical system used therein.

In accordance with one aspect of the present invention, there is provided a projection exposure system including a projection optical system (2) with an optical axis (AX), for projecting under an exposure illumination light beam (EL) and through said projection optical system (2) an image of a portion of transfer patterns formed on a mask (1) onto a photosensitive substrate (3), said projection exposure system comprising: a mask stage (5) for holding said mask (1) and moving said mask (1) in a first direction ((+Y)- or (−Y)-direction) in a plane perpendicular to said optical axis (AX) of said projection optical system (2); a first reference member (9) disposed on said mask stage (5) and having a first reference mark (MM1) formed thereon; a substrate stage (17) for holding said substrate (3) and moving said substrate (3) in a second direction ((−Y)- or (+Y)-direction) in a plane (XY-plane) perpendicular to said optical axis (AX) of said projection optical system (2), said second direction corresponding to said first direction; a second reference member (25) disposed on said substrate stage (17) and having a second reference mark (WM1) formed thereon; and mark detection means (10, 11) for detecting a relative position shift between one (MM1) of said first and second reference marks (MM1, WM1) and an image of the other (WM1) of said first and second reference marks (MM1, WM1) formed through said projection optical system.

In such projection exposure system, said first reference mark may comprise a plurality of reference marks (MP) arranged in a 2-dimensional array on said first reference member (9). Said second reference mark for use with such first reference mark may comprise a plurality of reference marks (WP) arranged in a 2-dimensional array on said second reference member (25).

Alternatively, said second reference mark may comprise a 1-dimensional grating pattern (WM3) having a predetermined pitch in the direction transverse to said second direction. The image (MM3) of said first reference mark for use with such first reference mark, formed on said substrate stage (17) through said projection optical system (2), may comprise a 1-dimensional grating pattern having a pitch different from said predetermined pitch and in the direction substantially equal to said direction of said pitch of said second reference mark (WM3). Further, said mark detection means for use with such first and second reference marks may preferably comprise an imaging device (26) disposed on the bottom surface of said second reference member (25C).

Yet alternatively, said second reference mark may comprise a 2-dimensional grating pattern (WM4) having predetermined pitches in two different directions, the image (MM4) of said first reference mark formed on said substrate stage (17) through said projection optical system (2) may comprise a 2-dimensional grating pattern having pitches different from said predetermined pitches and in the directions substantially equal to said two directions of said pitches of said second reference mark (WM4), and said mark detection means may preferably comprise a 2-dimensional imaging device (26) disposed on the bottom surface of said second reference member (25D).

Further, such projection exposure system may preferably comprise calculation means (100) for calculating at least one of the magnification of said projection optical system (2) and the distortion of said projection optical system (2) based on said relative position shift.

By virtue of the above arrangement of the projection exposure system according to the present invention, the measurement of the relative position shift between the first reference mark (MM1) and the second reference mark (WM1) may be performed between the exposure operations such as between one shot-exposure and the next, or within certain waiting times such as those for reloading the wafers, so that quick detection of any variation in the magnification of the projection optical system (2) may be achieved. Since the first reference member (9) remains on the mask stage, it is unnecessary to use any separate reference mask or the like for the measurement.

When the first and second reference marks each comprises a plurality of reference marks (MP and WP) arranged in a 2-dimensional array, averaged values of a plurality of relative position shifts may be obtained so that any variation in the projection magnification may be detected with higher accuracy. Further, by virtue of the arrangement of both the first and second reference marks in 2-dimensional arrays, the variations in the magnification in two directions (X- and Y-directions) perpendicular to the optical axis (AX) as well as perpendicular to each other may be detected.

When the first reference mark comprises a 1-dimensional grating pattern and the projected image of the second reference mark projected on the substrate stage (17) comprises a 1-dimensional grating pattern having a pitch slightly different from the pitch of the first reference mark, the interference fringes of a moire generated by the two gratings having their pitches slightly different from each other may be detected through an imaging device (26) so that any variations in the magnification and the distortion of the projecting optical system (2) may be detected with very high accuracy.

When the first reference mark comprises a 2-dimensional grating pattern and the projected image of the second reference mark projected on the substrate stage (17) comprises a 2-dimensional grating pattern having a pitch slightly different from the pitch of the first reference mark, the interference fringes of a moiré generated by the two gratings having their pitches slightly different from each other may be detected through a 2-dimensional imaging device so that any variations in the magnification and the distortions in two directions (X- and Y-directions) perpendicular to the optical axis (AX) as well as perpendicular to each other may be detected with very high accuracy.

Further, when the direction of the pitch of the second reference mark is a non-scanning direction (X-direction) perpendicular to the second direction and the direction of the pitch of the first reference mark is a non-scanning direction (X-direction) perpendicular to the first direction, the distortion in the non-scanning direction may be measured with accuracy.

In the above arrangement of the projection exposure system according to the present invention, reference members (reference plates) having reference marks (reference patterns) formed thereon are disposed on the mask and on the photosensitive substrate (wafer) (mounted on the mask stage and on the substrate stage), the position shift between the reference marks are measured to drive the relative variations, and the relative variations are used to detect the variations in the magnification and the distortion of the projection optical system, so that it is unnecessary to road reference masks (reference substrate) and quick measurement of the variations in the magnification and the distortion of the projection optical system may be achieved.

Further, since the reference members remain mounted on the projection exposure system, no variation in the positions of the reference members and thus no error associated therewith can occur unlike any of the existing systems using reference masks. The reference members remain under stabilized conditions and will not be mounted and demounted on and from the system unlike the reference masks, so that they are subject to little aging and advantageously enable the measurement of the magnification and other factors with high accuracy.

When the first and second reference marks each comprises a plurality of reference marks arranged in a 2-dimensional array, averaged values may be used to detect any variation in the projection magnification with higher accuracy, and the variations in the magnification in two directions may be detected as well. The tendency of the distortion may be also detected.

When the projection exposure system comprise calculation means for calculating at least one of the magnification and the distortion of the projection optical system based on the relative position shift, the magnification or the distortion of the projection optical system may be quickly calculated.

In accordance with another aspect of the present invention, there is provided a scanning projection exposure system, which has further features in addition to the above; when the mark detection means comprises an optical detection means for detecting, from above the mask, relative position shift between the first reference mark and the image of the second reference mark formed through both the projection optical system and the mask, the relative position shift between the first reference mark and the image of the second reference mark may be measured using TTR technique, the mark detection means may be easily mounted on the projection exposure system, and the measurement is performed with ease.

When the direction of the pitch of the second reference mark is a non-scanning direction (X-direction) perpendicular to the second direction and the direction of the pitch of the first reference mark is a non-scanning direction (X-direction) perpendicular to the first direction, the position shift in the non-scanning direction may be measured with accuracy. Therefore, any variations in the magnification and the distortion in the non-scanning direction may be detected with accuracy.

Further, when the first reference mark comprises a 2-dimensional grating pattern and the projected image of the second reference mark projected on the substrate stage comprises a 2-dimensional grating pattern having a pitch slightly different from the pitch of the first reference mark, the interference fringes of a moiré generated by the two gratings having their pitches slightly different from each other may be detected through a 2-dimensional imaging device so that any variations in the magnification and the distortions in the scanning direction and the non-scanning direction perpendicular to the optical axis as well as perpendicular to each other may be detected with very high accuracy.

The above and other objects, features, and advantages of the present invention will become apparent from the following description when taken in conjunction with the accompanying drawings which illustrate preferred embodiments of the present invention by way of example.

DESCRIPTION OF THE PREFERRED EMBODIMENTS

Referring now to FIGS. 1 to 6, a projection exposure system according to a first embodiment of the present invention is described. The first embodiment illustrates an application of the present invention to a step-and-repeat projection exposure system in which an image of patterns on a reticle is projected for exposure with magnification onto one shot-field after another on a wafer through a projection optical system.

Figure 1:
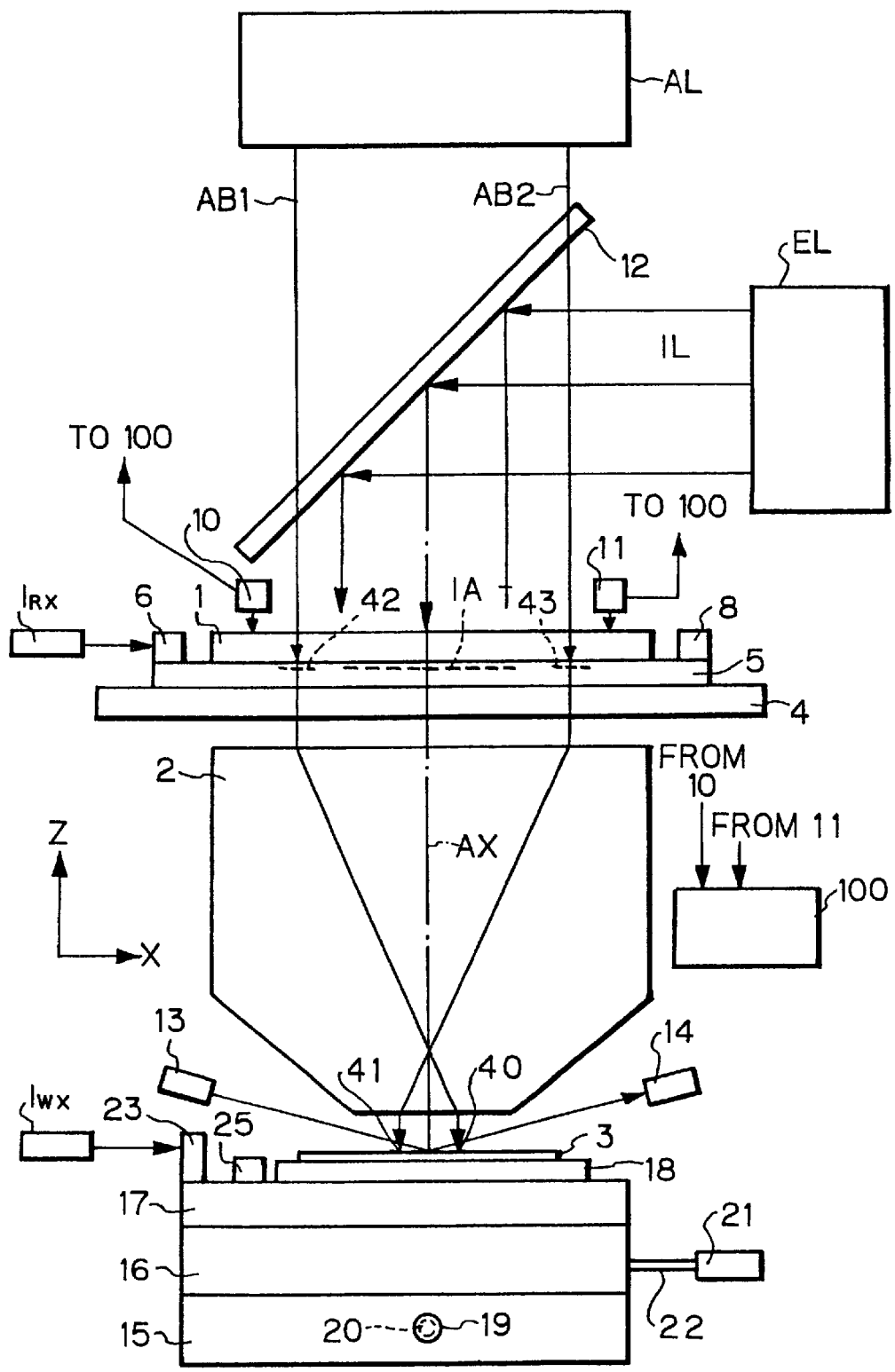
FIG. 1 is a schematic showing a projection exposure system according to an embodiment of the present invention.

FIG. 1 shows a schematic of a projection exposure system according to the first embodiment. As shown, an illumination beam IL for exposure exiting from an illumination optical system EL is reflected by a dichroic mirror 12, which is positioned diagonally at an angle of 45 degrees relative to the plane of a reticle (or mask) 1, to illuminate an illumination area IA on the reticle 1, so that circuit patterns formed within the illumination area IA is demagnified and transferred onto the surface of a wafer (or a photosensitive substrate) 3 through a projection optical system 2 with the magnification $\beta$ ($\beta=\frac{1}{4}$ in this embodiment). In FIG. 1, we define the direction of the optical axis AX of the projection optical system 2 as Z-direction, the direction which is parallel with the sheet surface of this drawing and perpendicular to Z-direction as X-direction, and the direction which is perpendicular to the sheet surface as Y-direction.

Figure 2:
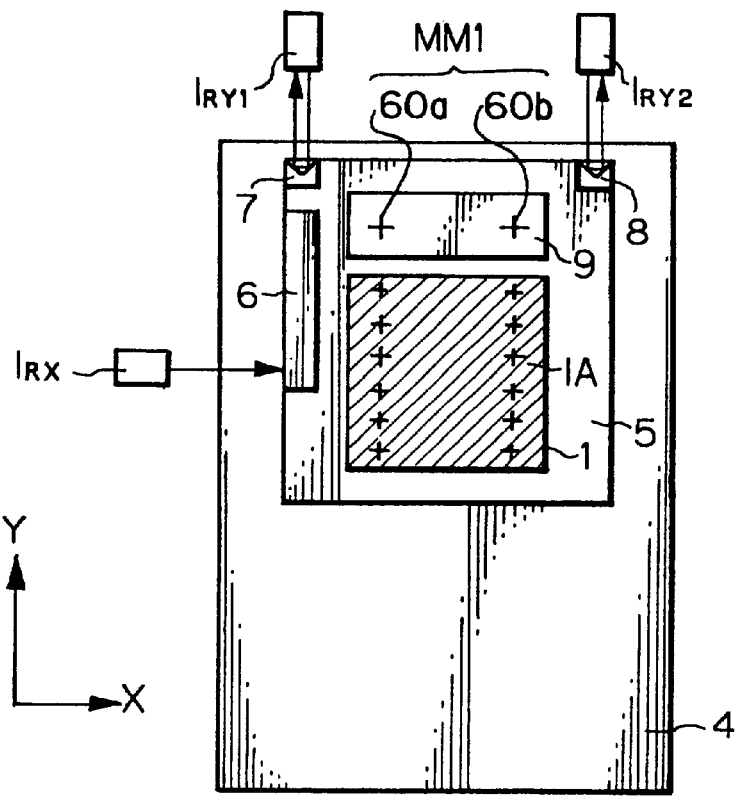
FIG. 2 is a plan view showing a reticle stage of FIG. 1.

FIG. 2 is a plan view showing an arrangement of various components around the reticle 1, which arrangement is described below in detail with reference to FIGS. 1 and 2.

As shown in FIG. 1, a reticle base 4 carries a reticle stage (or mask stage) 5 on which the reticle 1 having circuit patterns formed thereon is fixedly held by vacuum suction. The reticle stage 5 is capable of alignment of the reticle 1 in a 2-dimensional plane which is perpendicular to the optical axis AX of the projection optical system 2 (i.e., in an XY-plane), with respect to the positions of the reticle 1 in X-direction, in Y-direction, and in a rotational direction (θ-direction). As shown in FIGS. 1 and 2, the coordinates of the position of the reticle stage 5 in the 2-dimensional plane are determined by means of moving mirrors 6, 7 and 8 mounted on the reticle stage 5 and laser interferometers $I_{RX}$, $I_{RY1}$ and $I_{RY2}$ disposed around the reticle stage 5. Specifically, the reticle stage 5 is of a rectangular shape in plan and has four sides. One laser interferometer $I_{RX}$ is disposed near one of the sides of the reticle stage 5 that faces to (−X)-direction, and the corresponding one moving mirror 6 is mounted on the reticle stage 5 at the position near that side of the reticle stage 5 (i.e., the side facing to (−X)-direction). The moving mirror 6 has a shape elongated in Y-direction. The combination of the laser interferometer $I_{RX}$ and the moving mirror 6 is used to determine X-coordinate of the position of the reticle stage 5. The other two laser interferometers $I_{RY1}$ and $I_{RY2}$ are disposed near both ends of the side of the reticle stage 5 that faces to (+Y)-direction, and the other two moving mirrors 7 and 8 corresponding to these laser interferometers are mounted on the reticle stage 5 at positions near those ends of the reticle stage 5 (i.e., both ends of the side facing to (+Y)-direction). The moving mirrors 7 and 8 are corner-cube mirrors. The combination of the laser interferometers $I_{RY1}$, $I_{RY2}$ and the moving mirrors 7, 8 is used to determine Y-coordinate of the position of the reticle stage 5. The position of the reticle stage 5 is continuously detected by means of the laser interferometers $I_{RX}$, $I_{RY1}$, and $I_{RY2}$ with a certain resolution (for example, with a resolution of the order of 0.01 micrometer). Further, the angle of the rotational displacement of the reticle stage 5 is detected from the difference between the measurements of the laser interferometers $I_{RY1}$ and $I_{RY2}$.

As shown in FIG. 2, a first reference plate 9 is mounted on the reticle stage 5 at the position adjacent the reticle 1 and near one of the sides of the reticle stage 5 that faces to (+Y)-direction. The first reference plate 9 comprises a rectangular, transparent glass plate, which is described below in more detail. A second reference plate 25 is mounted on a wafer leveling table 17. The second reference plate 25 comprises a transparent glass plate, which is described below in more detail. Further, observation optical systems 10 and 11 for observing both the first and second reference plates 9 and 25 are disposed above the (−X)-direction side and X-direction side of the reticle stage 5, respectively. These observation optical systems 10 and 11 provide mark-position-error information to be sent to a main control 100, which uses the information to derive the magnification ratio and the distortion of the projection optical system 2 by calculation. Moreover, the main control 100 generally controls the entire projection exposure system.

Figure 3:
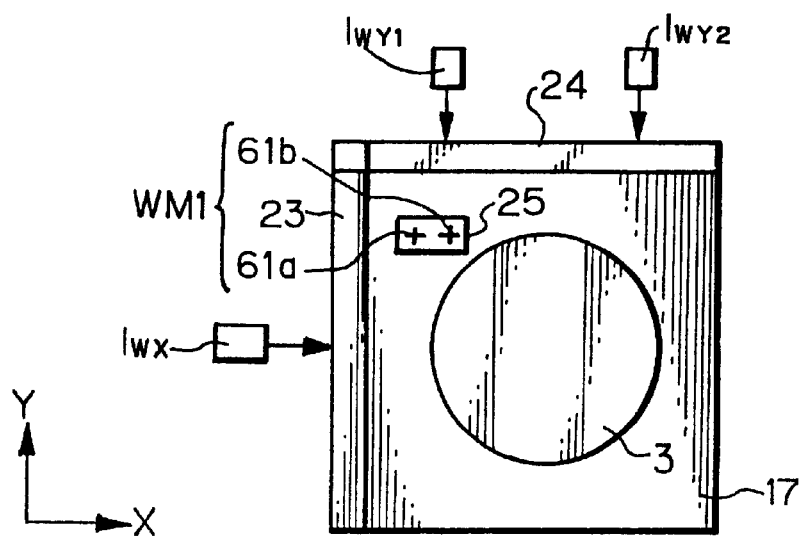
FIG. 3 is a plan view showing a wafer stage of FIG. 1.

FIG. 3 is a plan view showing an arrangement of a wafer stage (or substrate stage) used in the projection exposure system according to the first embodiment. This arrangement is described in detail with reference to FIGS. 1 and 3. The wafer stage is a unit or assembly comprising a wafer holder 18, the wafer leveling table 17 mentioned above, a wafer X-stage 16 and a wafer Y-stage 15.

As shown in FIG. 1, a wafer 3 is fixedly held on the wafer holder 18 by vacuum suction. The wafer holder 18 is carried on the wafer leveling table 17, which, in turn, is carried on the wafer X-stage 16 which is movable in X-direction by a stroke equal to the diameter of a largest possible wafer that may be processed by the projection exposure system. The wafer X-stage 16 is carried on the wafer Y-stage 15 which is movable in Y-direction by a stroke again equal to the diameter of a largest possible wafer that may be processed by the projection exposure system.

The wafer Y-stage 15 is driven by an electric motor 19 through a feed screw 20 to move in Y-direction relative to a system base (not shown). The wafer X-stage 16 is driven by an electric motor 21 through a feed screw 22 to move in X-direction relative to the wafer Y-stage 15. The wafer leveling table 17 is driven by a drive unit (not shown) to swing or tilt in any directions relative to the image plane of the projector optical system 2 as well as to minutely move in the direction of the optical axis AX of the projector optical system 2 (i.e., in Z-direction). The wafer leveling table 17 is also capable of rotation about the optical axis AX.

As shown in FIG. 3, the wafer leveling table 17 is of a rectangular shape in plan. A laser interferometer $I_{WX}$ is disposed facing with one of the sides of the wafer leveling table 17 that faces to (−X)-direction, and a moving mirror 23 corresponding to the laser interferometer $I_{WX}$ is mounted on the wafer leveling table 17 along that side of the wafer leveling table 17 (i.e., the side facing to (−X)-direction) for reflecting back the laser beam emitted from the laser interferometer $I_{WX}$. The combination of the laser interferometer $I_{WX}$ and the moving mirror 23 is used to determine X-coordinate of the position of the wafer leveling table 17. Further, a pair of laser interferometers $I_{WY1}$ and $I_{WY2}$, which are spaced apart from each other in X-direction, are disposed facing with respective ends of another side of the wafer leveling table 17 that faces to (+Y)-direction, and a second moving mirror 24 corresponding to these laser interferometers $I_{WY1}$ and $I_{WY2}$ is mounted on the wafer leveling table 17 along that side of the wafer leveling table 17 (i.e., the side facing to (+Y)-direction. The combination of the laser interferometers $I_{WY1}$ and $I_{WY2}$ and the moving mirror 24 is used to determine Y-coordinate of the position of the wafer leveling table 17. The second reference plate 25 mentioned above is mounted on the wafer leveling table 17 at the position near a peripheral portion of the wafer 3. The second reference plate 25 is described below in more detail.

Further, as shown in FIG. 1, a focal point detection system is provided which comprises a light-emitting optical system 13 and a light-receiving optical system 14. The light-emitting optical system 13 projects an image of a pin-hole or a slit-pattern onto the exposure surface of the wafer 3 near the image plane of the projection optical system 2, the projection being made obliquely at a certain angle relative to the optical axis AX. The light-receiving optical system 14 receives the reflected light beam from the projected image to form again an image of the projected image. The position in Z-direction of the surface of the wafer 3 is detected by the focal point detection system comprising the optical systems 13 and 14, and the detection information is used to perform an auto-focusing operation to align the surface of the wafer 3 with the image plane of the projection optical system 2.

Next described is an alignment optical system AL used in this embodiment and shown in FIG. 1. The alignment optical system AL in this embodiment is of a Field Image Alignment (FIA) type in which an image processing technique is used to measure any position shift between the images of a reticle mark and a wafer mark.

Figure 5:
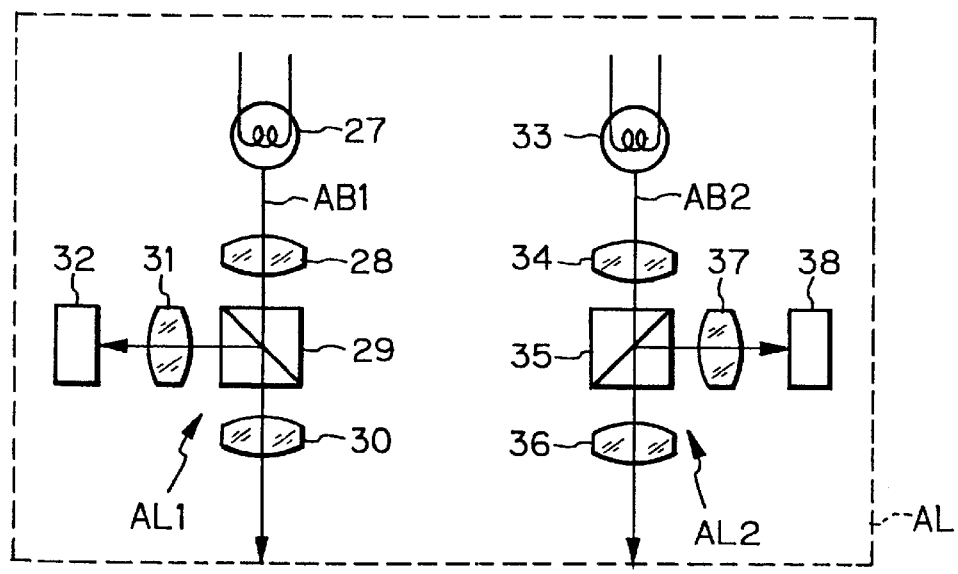
FIG. 5 is a schematic showing an alignment optical system AL of FIG. 1.

FIG. 5 is a schematic showing the alignment optical system AL. As shown in FIG. 5, the alignment optical system AL comprises two alignment observation systems AL1 and AL2, each of which is capable of detection of the position shifts in both X- and Y-directions. As shown in FIG. 1, respective alignment light beam AB1 and AB2 exiting from the alignment observation systems AL1 and AL2 of the alignment optical system AL pass through different areas of the dichroic mirror 12 to illuminate different areas of the reticle 1. Portions of the alignment beams are reflected by the reticle 1, while the remaining portions of the beams pass through the reticle 1 and through the projection optical system 2 to illuminate different areas on the surface of the wafer 3. The alignment light beams AB1 and AB2 incident on the surface of the wafer 3 are then reflected, again pass through the projection optical system 2, and pass through the different areas of the dichroic mirror 12 together with the respective portions of the beams reflected by the reticle 1 mentioned above, to return to the corresponding alignment observation systems AL1 and AL2 of the alignment optical system AL.

Specifically, in one alignment observation system AL1, the alignment light beam AB1 exits from a light source 27 shown in FIG. 5, passes through a condenser lens 28, a beam splitter 29, an objective lens 30 and the dichroic mirror 12 shown in FIG. 1, and illuminates a reticle mark 42 formed on the reticle 1 and a wafer mark 40 formed on the wafer 3. The reflected light beam from the reticle mark 42 and that from the wafer mark 40 pass again through the objective lens 30 shown in FIG. 5 and are reflected by the beam splitter 29 to pass through the image forming lens 31 to be received by a 2-dimensional CCD imaging device 32.

Similarly, in the other alignment observation system AL2, the alignment light beam AB2 exits from a light source 33, passes through a condenser lens 34, a beam splitter 35, an objective lens 36 and the dichroic mirror 12 shown in FIG. 1, and illuminates a reticle mark 43 formed on the reticle 1 and a wafer mark 41 formed on the wafer 3. The reflected light beam from the reticle mark 43 and that from the wafer mark 41 pass again through the objective lens 36 shown in FIG. 5 and are reflected by the beam splitter 35 to pass through the image forming lens 37 to be received by a 2-dimensional CCD imaging device 38.

Figure 6:
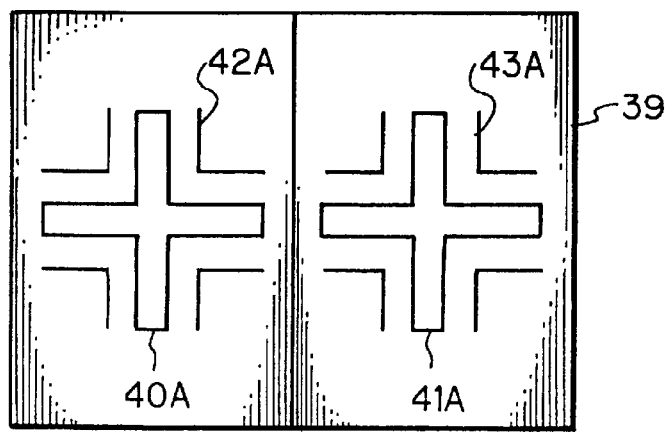
FIG. 6 shows images of reticle marks and wafer marks observed through the alignment optical system of FIG. 1 and displayed on a screen of a CRT display.

FIG. 6 schematically shows images picked up by the 2-dimensional CCD imaging devices 32 and 38 and displayed on a screen of a CRT (cathode ray tube) display 39. As shown, a first set of images comprising an image 42A of the reticle mark 42 and an image 40A of the wafer mark 40 picked up by the 2-dimensional CCD imaging device 32 and a second set of images comprising an image 43A of the reticle mark 43 and an image 41A of the wafer mark 41 picked up by the 2-dimensional CCD imaging device 38 are parallelly displayed on one screen of the CRT display 39 by using a known split screen technique. These two sets of images are processed to determine any position shifts between the reticle marks 42, 43 and the corresponding wafer marks 40, 41. The two alignment observation systems AL1 and AL2 are spaced apart from each other in X-direction, and the distance between them is variable, so the projection exposure system can be adapted to various sizes of exposure shots.

Next, the operations of the wafer stage for the alignment operation and the exposure operation are described.

As shown in FIG. 1, a wafer 3 is transferred and loaded on the wafer holder 18 by a wafer loader (not shown) and fixedly held on the wafer holder 18 by vacuum suction. Then, the alignment of the wafer 3 is performed by a rough alignment system (not shown) so that the registration of the order of several micrometers is achieved. Then, the wafer marks 40 and 41 that are associated with the first one of the shot-fields on the wafer 3 (i.e., the shot-field to be exposed first) are aligned within the view fields of the two alignment observation systems AL1 and AL2 shown in FIG. 5. For this alignment, the position of the wafer 3 is adjusted by the wafer X-stage 16 and the wafer Y-stage 15 under the control based on the values measured by the laser interferometers $I_{WX}$, $I_{WY1}$ and $I_{WY2}$. At the same time, the reticle marks 42 and 43 are aligned within the view fields of the two alignment observation systems AL1 and AL2 as well.

Then, one alignment observation system AL1 determines the relative position shift ($\Delta xa_1$, $\Delta ya_1$) between the positions of the reticle mark 42 and the wafer mark 40, while the other alignment observation system AL2 determines the relative position shift ($\Delta xa_2$, $\Delta ya_2$) between the positions of the reticle mark 43 and the wafer mark 41, where $\Delta xa_1$ and $\Delta xa_2$ represent position shift components in X-direction, and $\Delta ya_1$ and $\Delta ya_2$ represent position shift components in Y-direction. Then, the reticle stage 5 is minutely moved in an attempt to reduce all of these position shift components to zero (or to values less than a predetermined reference value). The alignment is thus achieved. Once the alignment is achieved, the exposure operation is started by emitting exposure light beam. During the exposure operation, the alignment operation is continued.

Figure 4:
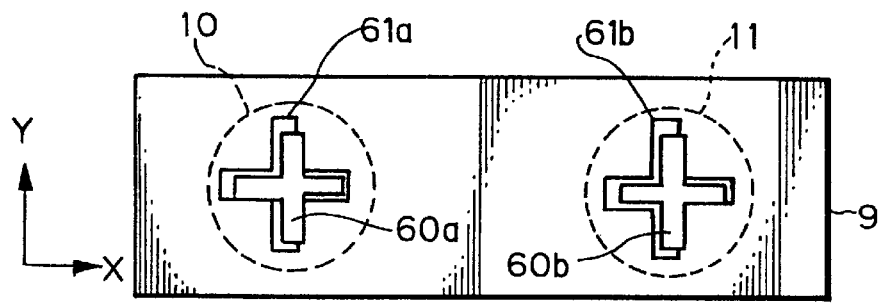
FIG. 4 shows images of reference patterns MM1 and WM1 of FIGS. 2 and 3 observed through observation optical systems 10 and 11 of FIG. 1.

Referring next to FIGS. 2 to 4, it is described how to detect any variation in the magnification and other factors the projection optical system used in the projection exposure system of this embodiment.

As shown in FIGS. 2 and 3, the elongate, transparent first reference plate 9 mounted on the reticle stage 5 and extending in X-direction has a first reference pattern MM1 formed thereon. The first reference pattern MM1 comprises two cross-marks 60a and 60b formed at positions near both ends of the first reference plate 9. The elongate second reference plate 25 mounted on the wafer leveling table 17 and extending in X-direction has a second reference pattern WM1 formed thereon. The second reference pattern WM1 comprises two cross-marks 61a and 61b formed at positions near both ends of the second reference plate 25. The second reference pattern WM1 has a shape which corresponds to the shape of the first reference pattern MM1 inverted and demagnified with the magnification substantially equal to the magnification $\beta$ of the projection optical system 2. For convenience, FIG. 3 illustrates the second reference pattern WM1 with the appearance of the projected image thereof that is projected onto the reticle stage 5 through the projection optical system 2. In every embodiment described here, the second reference pattern is designed to have its actual size equal to the size of the first reference pattern demagnified with the magnification substantially equal to the magnification $\beta$ of the projection optical system 2. Further, in the drawings, either the first reference pattern or the second reference pattern is illustrated by the appearance of the projected image thereof that is projected onto the wafer leveling table 17 or reticle stage 5, respectively, through the projection optical system 2.

For detecting any variation in the magnification, in the first place, the first reference plate 9 mounted on the reticle stage 5 is aligned under the illumination area IA of the exposure light beam. At the same time, the second reference plate 25 mounted on the wafer leveling table 17 is aligned under an area conjugate to the illumination area IA. For this alignment, the reticle stage 5 is moved so as to move the first reference plate 9 into the illumination area IA as shown in FIG. 2. Then, the first reference pattern MM1 on the first reference plate 9 and the second reference pattern WM1 on the second reference plate 25 are observed through the observation optical systems 10 and 11. Although what is actually observed through the observation optical systems is not the second reference pattern WM1 but the projected image thereof that is projected on the reticle stage 5 through the projection optical system 2, we simply express it as "the second reference pattern WM1 is observed" for simplicity of the description. Such expression may be used as well in the description relating to the observed image hereinafter.

FIG. 4 shows images which may be observed through the observation optical systems 10 and 11. As shown, the first reference pattern MM1 on the first reference plate 9 and the second reference pattern WM1 on the second reference plate 25 are observed being superimposed. Specifically, one mark 60a of the first reference pattern MM1 and one mark 61a of the second reference pattern WM1 are observed being superimposed through one observation optical system 10 schematically indicated by a broken line circle in FIG. 4, while the other mark 60b of the first reference pattern MM1 and the other mark 61b of the second reference pattern WM1 are observed being superimposed through the other observation optical system 11 also schematically indicated by a broken line circle in FIG. 4. In the observation optical systems 10 and 11, these observations are used to determine relative position shifts ($\Delta_{x1}$, $\Delta_{x2}$) in X-direction between the marks of the first reference pattern MM1 and the marks of the second reference pattern WM1, where $\Delta_{x1}$ represents the position shift in X-direction between one mark 60a of the first reference pattern MM1 and one mark 61a of the second reference pattern WM1, and $\Delta_{x2}$ represents the position shift in X-direction between the other mark 60b of the first reference pattern MM1 and the other mark 61b of the second reference pattern WM1.

In the course of an initial adjustment of the projection exposure system, and more particular after completion of an initial adjustment of the magnification of the projection optical system 2, the relative position shifts in X-direction which are present at that time between the marks of the first reference pattern MM1 and the corresponding marks of the second reference pattern WM1 ($\Delta_x0_1$, $\Delta_x0_2$) are determined, and the difference between these two position shifts is calculated by the main control 100 according to the following equation (1) and stored in a lens control (not shown) as a value of reference magnification error A0.

$$A0 = \Delta_x0_2 - \Delta_x0_1 \tag{1}$$

Subsequently, during the exposure operation in which wafers are exposed using the exposure procedures as described above, relative position shifts ($\Delta_{x1}$, $\Delta_{x2}$) between the first and second reference patterns MM1 and WM1 are measured regularly at certain intervals. Every time relative position shifts have been measured, a projection magnification error A is derived according to the following equation (2).

$$A = \Delta_{x2} - \Delta_{x1} \tag{2}$$

The difference $\Delta A$ between the value A derived according to equation (2) and the value of the reference magnification error A0 is derived according to the following equation (3). This difference $\Delta A$ represents the variation in the projection magnification of the projection optical system 2.

$$\Delta A = A - A0 \tag{3}$$

This information about the variation in the projection magnification thus obtained is sent to the lens control, and thereby any error in the projection magnification can be quickly corrected by moving movable lens groups of the projection optical system 2 through the associated drive unit (not shown).

As clearly understood from the above, in the projection exposure system according to the first embodiment of the present invention, the superimposed images of the first reference pattern on the reticle stage 5 and the second reference pattern on the wafer leveling table 17 are observed through the observation optical systems 10 and 11 so as to obtain the difference between the relative position shifts at two positions spaced apart from each other in X-direction, and any variation in the projection magnification is easily derived from the value of the difference by calculation. By virtue of this, any variation in the projection magnification can be quickly detected and the correction of the magnification for any variation can be performed quickly as well.

Figure 7:
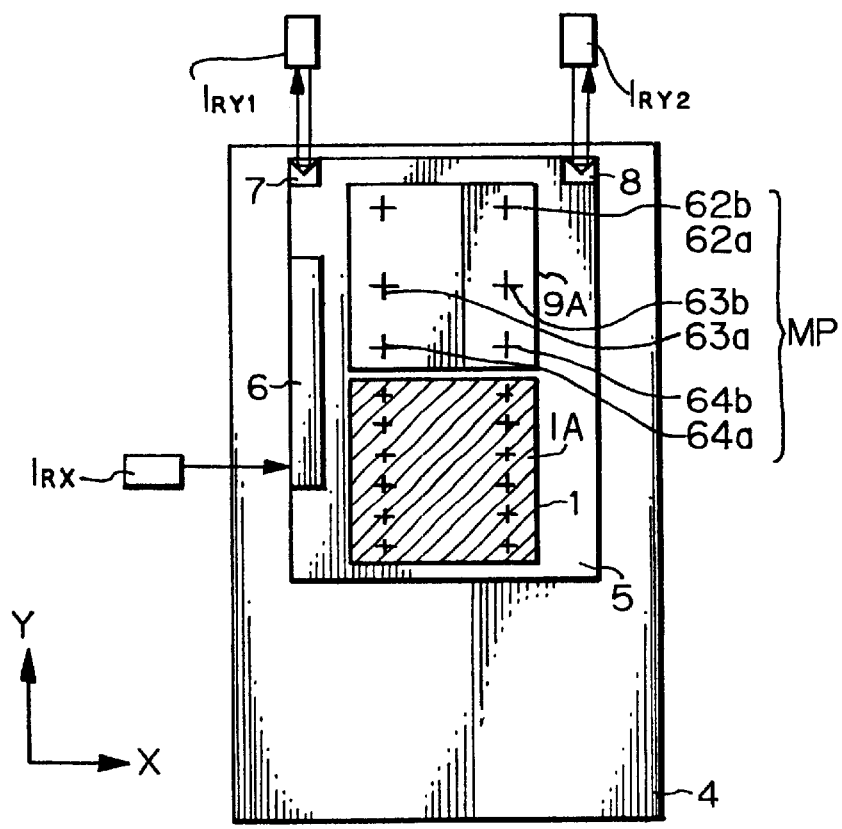
FIG. 7 is a plan view showing a reticle stage used in a projection exposure system according to another embodiment of the present invention.
Figure 8:
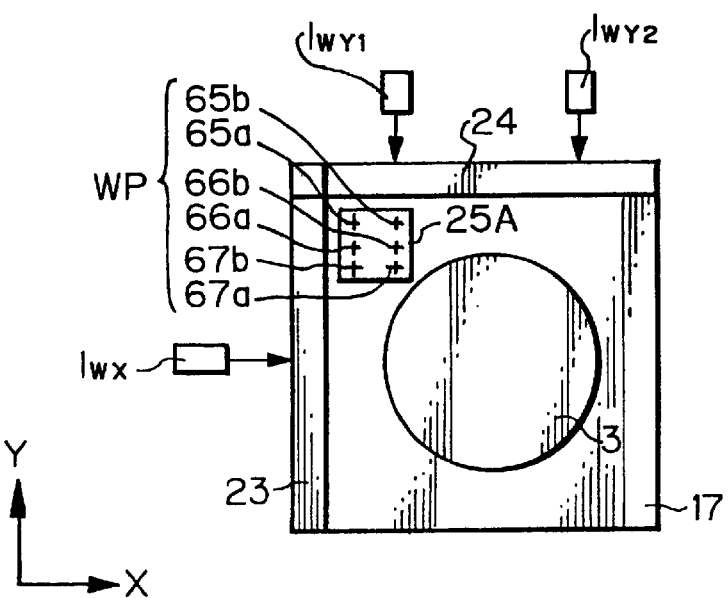
FIG. 8 is a plan view showing a wafer stage used with the reticle stage of FIG. 7.

Referring next to FIGS. 7 and 8, a projection exposure system according to a second embodiment of the present invention is described. The second embodiment differs from the first embodiment described above in the construction and arrangement of the first and second reference plates. Further, in consequence of the differences with respect to the first and second reference plates, the second embodiment also differs from the first embodiment in some additional points including the sizes and shapes of the reticle, the reticle stage and the reticle base. Nevertheless, since the first and second embodiments are the same in the basic arrangement and operations, like elements and components of the latter shown in FIGS. 7 and 8 are designated by the same reference numerals used with respect to the former in FIGS. 2 and 3, and will not be described in detail for simplicity.

FIG. 7 is a plan view showing an arrangement of various components on and around a reticle stage 5 of the second embodiment. As shown, the reticle stage 5 is of a rectangular shape in plan and has four sides. A first reference plate 9A is mounted on the reticle stage 5 at the position near one of the sides of the reticle stage 5 that faces to (+Y)-direction. The first reference plate 9A comprises a rectangular, transparent glass plate and has a first reference pattern MP formed thereon. The first reference pattern MP comprises three basic patterns each composed of a pair of cross-marks spaced apart from each other in X-direction. The three basic patterns are spaced apart from one another in Y-direction at substantially equal intervals. Specifically, one of the basic patterns that is positioned most to (+Y)-direction comprises a pair of cross-marks 62a and 62b spaced apart from each other in X-direction, the second, middle one comprises a pair of cross-marks 63a and 63b, and the third one that is positioned most to (−Y)-direction comprises a pair of cross-marks 64a and 64b.

FIG. 8 is a plan view showing an arrangement of various components on and around a wafer leveling table 17 of the second embodiment. As shown, the wafer leveling table 17 is of a rectangular shape in plan and has four sides and four corners. A second reference plate 25A is mounted on the wafer leveling table 17 at the position near one of the corners of the leveling table 17 that faces to (−X)- and (+Y)-directions. The second reference plate 25A comprises a rectangular, transparent glass plate and has a second reference pattern WP formed thereon. The second reference pattern WP comprises three basic patterns each composed of a pair of cross-marks spaced apart from each other in X-direction. The three basic patterns are spaced from one another in Y-direction at substantially equal intervals. Specifically, one of the basic patterns that is positioned most to (+Y)-direction comprises a pair of cross-marks 65a and 65b spaced apart from each other in X-direction, the second, middle one comprises a pair of cross-marks 66a and 66b, and the third one that is positioned most to (−Y)-direction comprises a pair of cross-marks 67a and 67b. As previously mentioned, the arrangement of the cross-marks of the second reference pattern WP is shown and described with respect to their images projected on the reticle stage 5 by the projection optical system 2.

Like the first embodiment described above, the projection exposure system of the second embodiment has observation optical systems 10 and 11 for observing the first reference plate 9A on the reticle stage 5 and the second reference plate 25A on the wafer leveling table 17, one observation optical system 10 being disposed above one of the sides of the reticle stage 5 that faces to (−X)-direction and the other observation optical system 11 being disposed above another of the sides of the reticle stage 5 that faces to (+X)-direction.

The projection exposure system of the second embodiment thus constructed performs the alignment operation and the exposure operation through the same procedures and in the same manner as that of the first embodiment.

Next, it is described how to detect any variation in the magnification and other factors of the projection optical system used in the projection exposure system of the second embodiment.

In the first place, the first reference plate 9A mounted on the reticle stage 5 is aligned under the illumination area IA. At the same time, the second reference plate 25A mounted on the wafer leveling table 17 is aligned under the illumination area IA. Then, the first reference pattern MP on the first reference plate 9A and the second reference pattern WP on the second reference plate 25A are observed through the observation optical systems 10 and 11.

Figure 9A:
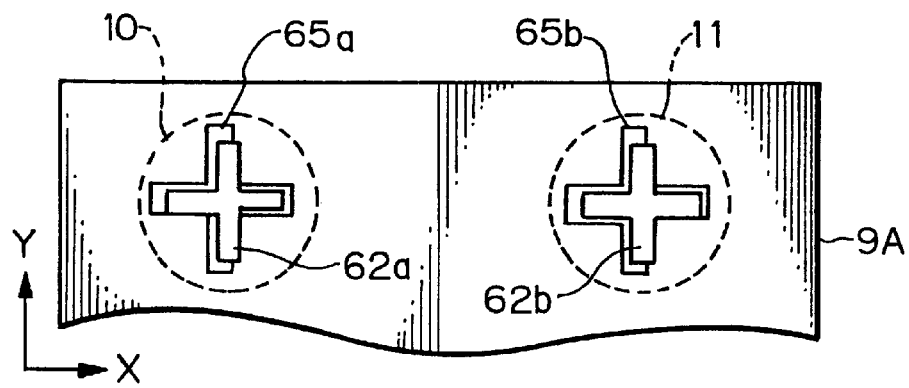
FIGS. 9(A) to 9(C) show the superimposed images of first reference pattern MP of FIG. 7 and second reference pattern WP of FIG. 8 observed through the observation optical systems.
Figure 9B:
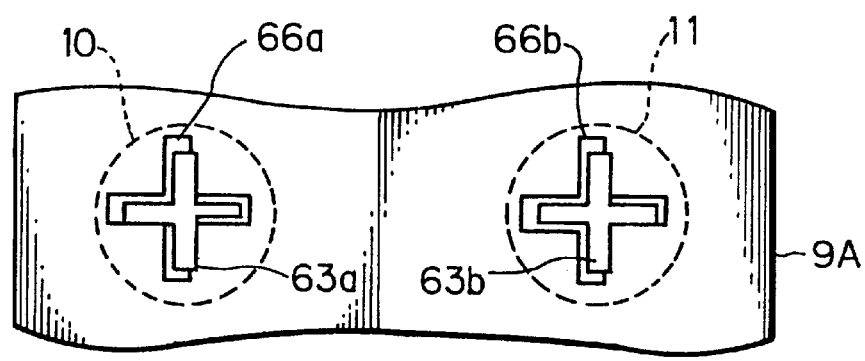
Figure 9C:
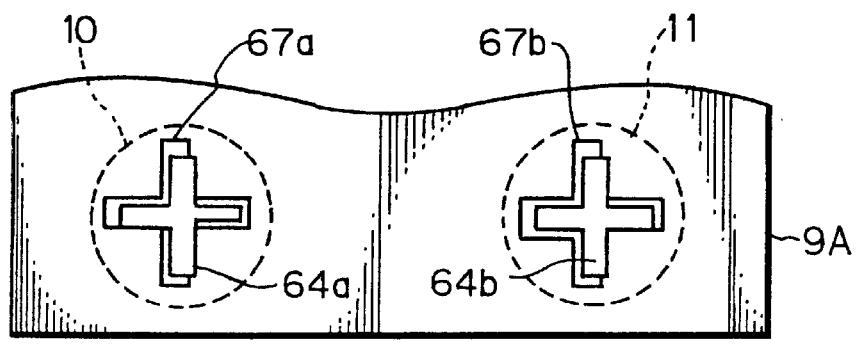

FIGS. 9(A) to 9(C) show images which may be observed through the observation optical systems 10 and 11. As shown, the images of the first reference pattern MP on the first reference plate 9A and the second reference pattern WP on the second reference plate 25A are observed being superimposed. FIGS. 9(A) to 9(C) show the images of the three sets of marks (the three basic patterns) successively observed one set after another through the observation optical systems 10 and 11 schematically indicated by broken line circles in these figures. Specifically, FIG. 9(A) shows the images of the first set of marks, in which the images of the mark 62a of the first reference pattern MP and the mark 65a of the second reference pattern WP are observed being superimposed through one observation optical systems 10, while the images of the mark 62b of the first reference pattern MP and the mark 65b of the second reference pattern WP are observed being superimposed through the other observation optical system 11. By moving the reticle stage 5 in (−Y)-direction by a distance equal to that between marks 62b and 63b and moving the wafer Y-stage 15 in (+Y)-direction by a distance equal to that between marks 65b and 66b, images which may be observed will change from those shown in FIG. 9(A) to those shown in FIG. 9(B). FIG. 9(B) shows the superimposed images of the mark 63a of the first reference pattern MP and the mark 66a of the second reference pattern WP, as well as the superimposed images of the mark 63b of the first reference pattern MP and the mark 66b of the second reference pattern WP. By further moving the reticle stage 5 in (−Y)-direction and the wafer Y-stage 15 in (+Y)-direction by appropriate distances, images which may be observed will change from those shown in FIG. 9(B) to those shown in FIG. 9(C). FIG. 9(C) shows the superimposed images of the mark 64a of the first reference pattern MP and the mark 67a of the second reference pattern WP, as well as the superimposed images of the mark 64b of the first reference pattern MP and the mark 67b of the second reference pattern WP.

In the second embodiment, the reticle stage 5 and the wafer stage are moved for successive observations of the sets of marks, as described. However, some modifications may be made in this respect. Specifically, the observation optical systems 10 and 11 may be constructed for horizontal movement, and they may be moved for successive observations of the sets of marks, while the reticle stage 5 and the wafer stage remain stationary. Alternatively, six observation optical systems may be provided and used for simultaneous observation of all the marks, if desirable.

In the observation optical systems 10 and 11, the above observations are used to determine, for each set of marks (i.e., for each basic pattern), relative position shifts ($\Delta_{xm1}$, $\Delta_{xm2}$) in X-direction between the marks of the first reference pattern MP and the corresponding marks of the second reference pattern WP.

The relative position shifts, which are thus determined through the observation optical systems 10 and 11, between the marks of the first and second reference patterns MP and WP for the first, second and third sets of marks are represented by ($\Delta_{x11}$, $\Delta_{x12}$), ($\Delta_{x21}$, $\Delta_{x22}$) and ($\Delta_{x31}$, $\Delta_{x32}$), respectively. The average values among these relative position shifts for the three sets of marks are then calculated according to the following equations (4) and (5). The results are used as the relative position shifts ($\Delta_{x1}$, $\Delta_{x2}$) between the first and second reference patterns MP and WP to obtain any variation in the projection magnification, according to the equations similar to those used in the first embodiment for the same purpose.

$$\Delta_{x1} = (\Delta_{x11} + \Delta_{x21} + \Delta_{x31})/3 \qquad (4)$$

$$\Delta_{x2} = (\Delta_{x12} + \Delta_{x22} + \Delta_{x32})/3 \qquad (5)$$

This information about the variation in the projection magnification thus obtained is sent to the lens control, and thereby any error in the projection magnification can be quickly corrected by moving movable lens groups of the projection optical system 2 through the associated drive unit (not shown).

Although the foregoing description is focused on the determination of the variation in the magnification in X-direction, the second embodiment is also capable of determination of the variation in the magnification in Y-direction. This may be achieved, for example, by using the observation optical system 10 to determine the relative position shift $\Delta_{Y11}$ in Y-direction between the mark 62a of the first reference pattern and the mark 65a of the second reference pattern, as well as the relative position shift $\Delta_{Y12}$ in Y-direction between the mark 64a of the first reference pattern and the mark 67a of the second reference pattern (see FIGS. 9(A) to 9(C)), and to process these relative position shifts in Y-direction ($\Delta_{Y11}$, $\Delta_{Y12}$) in the same manner as the relative position shifts in X-direction are processed as described. Further, it is contemplated that, in addition to this, the other observation optical system 11 may be used to determine the relative position shift $\Delta_{Y31}$ in Y-direction between the mark 62b of the first reference pattern and the mark 65b of the second reference pattern, as well as the relative position shift $\Delta_{Y32}$ in Y-direction between the mark 64b of the first reference pattern and the mark 67b of the second reference pattern, and to derive averaged values of the relative position shifts in Y-direction ($\Delta_{Y31}$, $\Delta_{Y32}$) and the above mentioned relative position shifts in Y-direction ($\Delta_{Y11}$, $\Delta_{Y12}$) so as to process the averaged values.

As clearly understood from the above, in the projection exposure system according to the second embodiment of the present invention, each of the first and second reference plates has three basic patterns (i.e., three sets of marks) formed thereon. The relative position shifts between the corresponding marks are determined for each set, and the averaged values of the relative position shifts for the sets are used to calculate the variation in the projection magnification. Therefore, any variation and the associated error can be detected and corrected with higher accuracy. Further, this method enables the detection of the variations and the correction of the associated errors in both the magnification in X- and Y-directions. Moreover, the characteristics of the distortion in the projected image projected by the projector optical system 2 may be recognized from the relative position shifts between the corresponding marks determined at six points.

Referring next to FIGS. 10 to 13, alternative examples of first and second reference patterns are described which may be formed on the first and second reference plates, respectively, for use in the projection exposure systems according to the first and second embodiments. Like elements and components shown in FIGS. 11(A)–11(C), 12 and 13(A)–13(C) are designated by the same reference numerals as used in FIGS. 2 and 3, and will not be described in detail for simplicity.

Figure 10A:
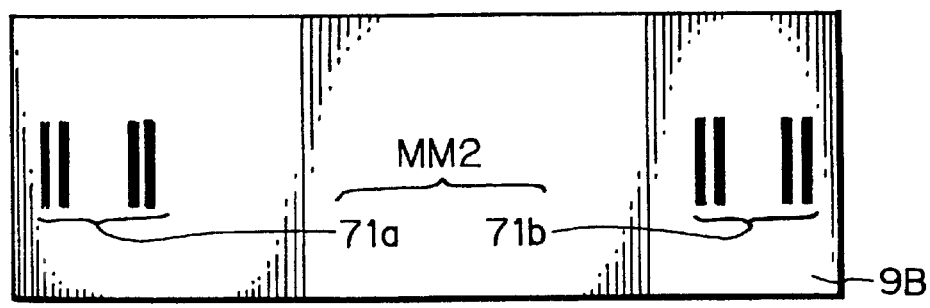
FIGS. 10(A) to 10(C) are plan views showing an alternative example of first and second reference patterns for use in a projection exposure system of the present invention.
Figure 10B:
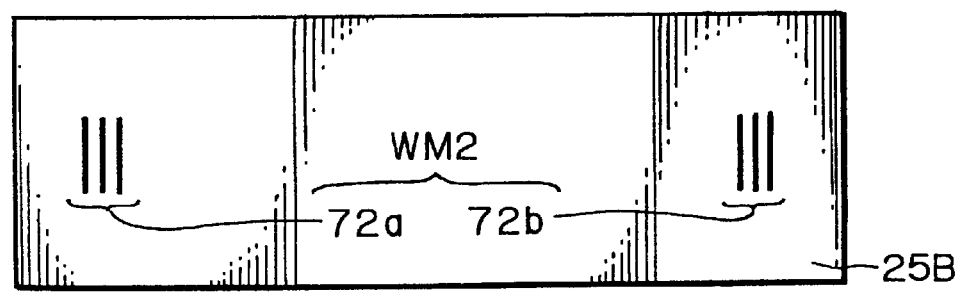
Figure 10C:
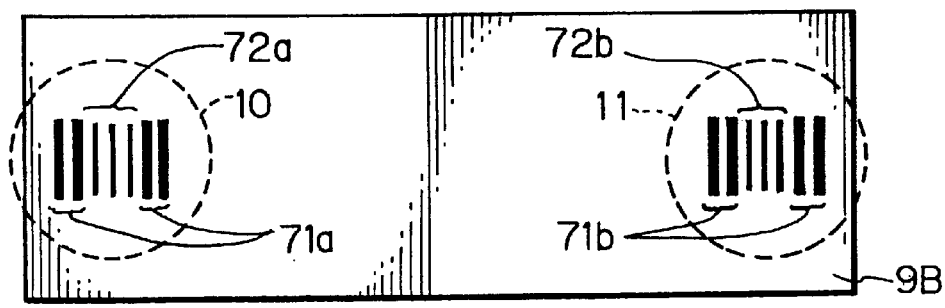
Figure 10C:
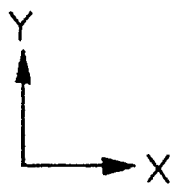

FIGS. 10(A) to 10(C) are plan views showing an alternative example of first and second reference patterns. Specifically, FIGS. 10(A) to 10(C) show a first reference pattern MM2 formed on a first reference plate 9B to be mounted on the reticle stage. The first reference pattern MM2 comprises a pair of stripes-marks 71a and 71b spaced apart from each other in X-direction by a predetermined distance. Each stripes-mark comprises two pairs of stripes, each pair comprising relatively thick two stripes parallelly extending in Y-direction and separated by a relatively narrow blank space. FIG. 10(B) shows a second reference pattern WM2 formed on a second reference plate 25B to be mounted on the wafer stage. The second reference pattern WM2 comprises a pair of stripes-marks 72a and 72b spaced apart from each other in X-direction, each stripes-marks comprising relatively thin three stripes parallelly extending in Y-direction. FIG. 10(C) shows the superimposed images of the first and second patterns observed within the view fields (indicated by the broken line circles in the figure) of the observation optical systems 10 and 11. Specifically, within the view field of one observation optical system 10, the superimposed images of one stripes-mark 71a of the first reference pattern MM2 and one stripes-mark 72a of the second reference pattern WM2 are observed with the latter stripes-mark 72a sandwiched between the pairs of the stripes of the former stripes-mark 71a. Similarly, within the view field of the other observation optical system 11, the superimposed images of the other stripes-mark 71b of the first reference pattern MM2 and the other stripes-mark 72b of the second reference pattern WM2 are observed with the latter stripes-mark 72b sandwiched between the pairs of the stripes of the former stripes-mark 71b. The observation optical systems 10 and 11 are used to measure the relative position shift between the strips-marks 71a and 72a and that between the strips-marks 71b and 72b, and the measured relative position shifts are used to determine and correct any error in the projection magnification.

Figure 11A:
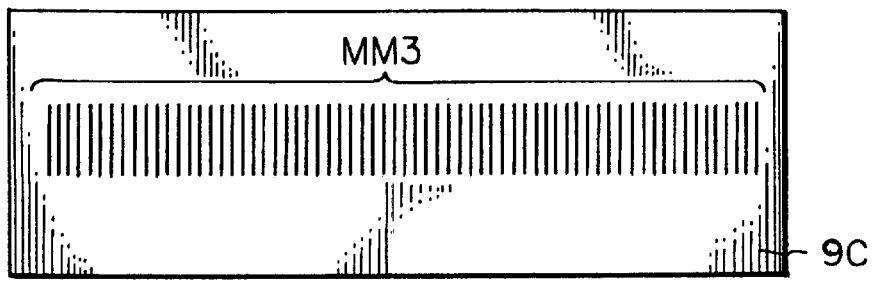
FIGS. 11(A) to 11(C) are plan views showing a further alternative example of first and second reference patterns for use in a projection exposure system of the present invention.
Figure 11B:
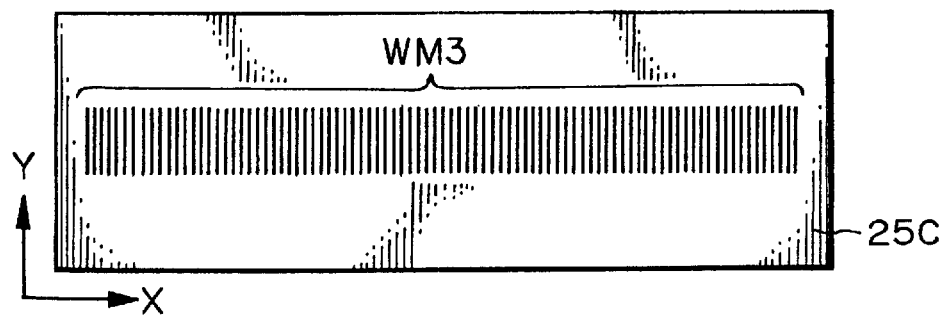
Figure 11C:
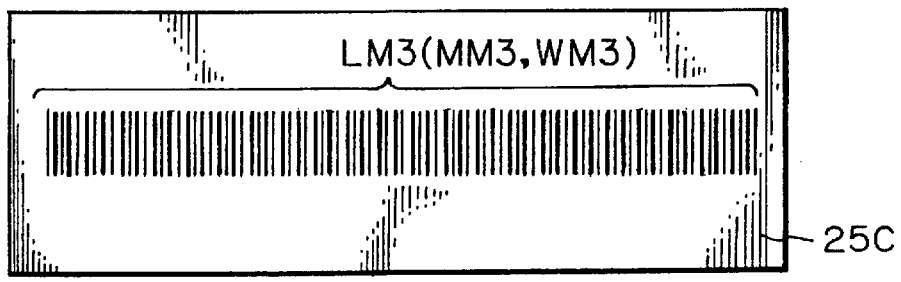

FIGS. 11(A) to 11(C) are plan views showing a further alternative example of first and second reference patterns, in which each reference pattern comprises a 1-dimensional grating pattern. Specifically, FIG. 11(A) shows a first reference pattern MM3, which is formed on a first reference plate 9C to be mounted on the reticle stage and comprises a 1-dimensional grating having a first pitch 4P1 (this designation "4P1" implies 4 (four) times a pitch P1 of a demagnified image of the first reference pattern described below). FIG. 11(B) shows a second reference pattern WM3, which is formed on a second reference plate 25C to be mounted on the wafer stage and comprises a 1-dimensional grating having a second pitch P2 which is nearly equal to and slightly different from the pitch P1 of the demagnified image of the first reference pattern. The demagnified image of the first reference pattern is reduced with the magnification 4:1. An imaging device such as two-dimensional CCD device 26 is attached to the bottom surface of the second reference plate 25C. When observing through the imaging device 26 the superimposed projected images of these two gratings having pitches slightly different from each other, we see a moiré which comprises interference fringes having a pitch equal to $(P1 \times P2)/(P1-P2)$. The interference fringes have an appearance of a grating pattern LM3 having this pitch, which results from the superimposition of the images of the first reference pattern MM3 and the second reference pattern WM3.

FIG. 11(C) shows interference fringes of a moiré which may be picked up by the imaging device 26. The interference fringes will displace in X-direction when the image of the 1-dimensional grating of the first reference pattern MM3 and/or the image of the 1-dimensional grating of the second reference pattern WM3 displaces in X-direction, and there are known relationships between the displacement of the interference fringes and the displacements of the images of the first and second reference patterns MM3 and WM3. The relationships are expressed by the following equations (6) and (7).

$$\Delta M_{X1} = \Delta t_{X1}(P1/(P1-P2)) \qquad (6)$$

$$\Delta M_{X2} = \Delta t_{X2}(P2/(P1-P2)) \qquad (7)$$

where:

$\Delta M_{X1}$ is the X-direction displacement of the interference fringes of the moiré caused by the X-direction displacement of the image of the 1-dimensional grating of the first reference pattern MM3;

$\Delta t_{X1}$ is the X-direction displacement of the image of the 1-dimensional grating of the first reference pattern MM3;

$\Delta M_{X2}$ is the X-direction displacement of the interference fringes of the moiré caused by the X-direction displacement of the image of the 1-dimensional grating of the second reference pattern WM3; and $\Delta t_{X2}$ is the X-direction displacement of the image of the 1-dimensional grating of the second reference pattern WM3.

Figure 12:
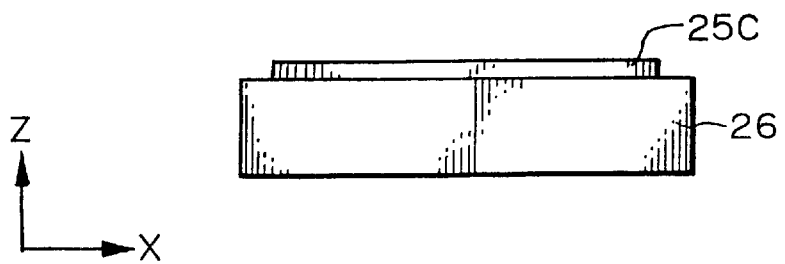
FIG. 12 is a front view showing an imaging device for observing interference fringes of a moiré generated by the first and second reference patterns of the present invention.

FIG. 12 shows the imaging device 26 for observing the interference fringes of the moiré resulting from the superimposition of the first reference pattern MM3 and the second reference pattern WM3. The imaging device 26 is disposed on the wafer stage and directly below the second reference plate 25C, and capable of detection of any displacement of the interference fringes of the moiré. In the course of an initial adjustment of the projection exposure system, the interference fringes of the moiré which is present at that time are picked up as the initial pattern, and the information about the initial pattern is stored in the lens control. Then, interference fringes of a moiré is measured when necessary and compared with the stored initial pattern to determine the displacement of the interference fringes by the main control 100. The determined displacement indicates any variation in the projection magnification and/or any variation in the distortion.

Figure 13A:
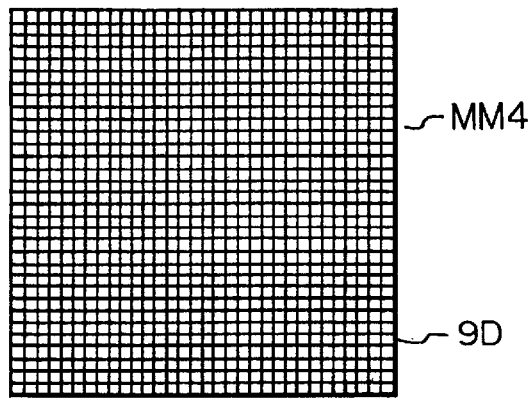
FIGS. 13(A) to 13(C) are plan views showing a yet further alternative example of first and second reference patterns for use in a projection exposure system of the present invention.
Figure 13B:
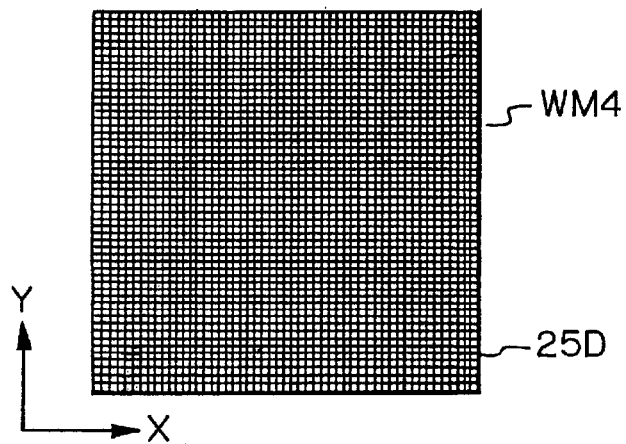
Figure 13C:
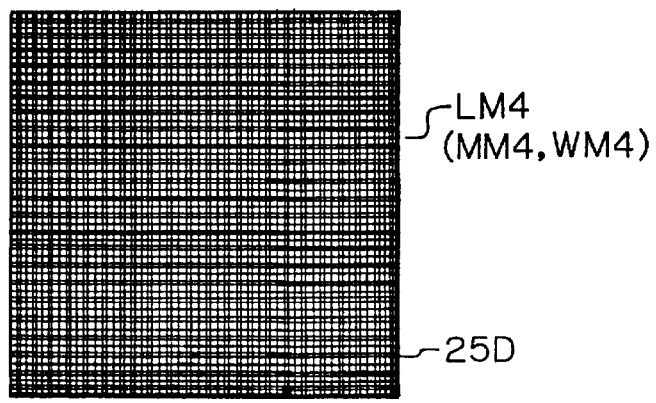

FIGS. 13(A) to 13(C) are plan views showing a yet further alternative example of first and second reference patterns, in which each reference pattern comprises a 2-dimensional grating pattern. Specifically, FIG. 13(A) shows a first reference pattern MM4, which is formed on a first reference plate 9D and comprises a 2-dimensional grating having both X-direction pitch and Y-direction pitch equal to a first pitch 4P3 (this designation "4P3" implies 4 (four) times a pitch P3 of a demagnified image of the first reference pattern described below). FIG. 13(B) shows a second reference pattern WM4, which is formed on a second reference plate 25D and comprises a 2-dimensional grating having a second pitch P4 which is nearly equal to and slightly different from the pitch P3 of the demagnified image of the first reference pattern. The demagnified image of the first reference pattern MM4 is reduced with the magnification 4:1.

When observing through an imaging device the superimposed projected images of these two 2-dimensional gratings having pitches slightly different from each other, we see a moiré which comprises interference fringes having both X-direction pitch and Y-direction pitch equal to (P3×P4)/(P3−P4), like a moiré resulting from the superimposition of the two 1-dimensional gratings shown in FIGS. 11(A) to 11(C). The interference fringes have an appearance of a 2-dimensional grating pattern LM4 having these new X- and Y-direction pitches, resulting from the superimposition of the images of the first reference pattern MM4 and the second reference pattern WM4.

FIG. 13(C) shows the 2-dimensional interference fringes LM4 of a moiré which may be observed through the imaging device. The interference fringes LM4 will displace in X-direction when the image of the 2-dimensional grating of the first reference pattern MM4 and/or the image of the 2-dimensional grating of the second reference pattern WM4 displaces in X-direction, like interference fringes resulting from the superimposition of the 1-dimensional gratings described above, according to the relationships expressed by the following equations (8) and (9).

$$\Delta M_{X3} = \Delta t_{X3}(P3/(P3-P4)) \quad (8)$$

$$\Delta M_{X4} = \Delta t_{X4}(P4/(P3-P4)) \quad (9)$$

where:
- $\Delta M_{X3}$ is the X-direction displacement of the interference fringes LM4 of the moiré caused by the X-direction displacement of the image of the 2-dimensional grating of the first reference pattern MM4;
- $\Delta t_{X3}$ is the X-direction displacement of the image of the 2-dimensional grating of the first reference pattern MM4;
- $\Delta M_{X4}$ is the X-direction displacement of the interference fringes LM4 of the moiré caused by the X-direction displacement of the image of the 2-dimensional grating of the second reference pattern WM4; and
- $\Delta t_{X4}$ is the X-direction displacement of the image of the 2-dimensional grating of the second reference pattern WM4.

Moreover, by using the 2-dimensional gratings of this example for the first and second reference patterns, not only the displacement in X-direction but also the displacement in Y-direction can be detected. Specifically, the interference fringes LM4 will displace in Y-direction when the image of the 2-dimensional grating of the first reference pattern MM4 and/or the image of the 2-dimensional grating of the second reference pattern WM4 displaces in Y-direction, according to the relationships expressed by the following equations (10) and (11).

$$\Delta M_{Y3} = \Delta t_{Y3}(P3/(P3-P4)) \quad (10)$$

$$\Delta M_{Y4} = \Delta t_{Y4}(P4/(P3-P4)) \quad (11)$$

where:
- $\Delta M_{Y3}$ is the Y-direction displacement of the interference fringes LM4 of the moiré caused by the Y-direction displacement of the image of the 2-dimensional grating of the first reference pattern MM4;
- $\Delta t_{Y3}$ is the Y-direction displacement of the image of the 2-dimensional grating of the first reference pattern MM4;
- $\Delta M_{Y4}$ is the Y-direction displacement of the interference fringes LM4 of the moiré caused by the Y-direction displacement of the image of the 2-dimensional grating of the second reference pattern WM4; and
- $\Delta t_{Y4}$ is the Y-direction displacement of the image of the 2-dimensional grating of the second reference pattern WM4.

The imaging device for observing and detecting the displacements of the interference fringes of the moiré in X- and Y-directions may comprise an imaging device which has a substantially square imaging surface and disposed directly below the second reference plate 25D. Again, in the course of an initial adjustment of the projection exposure system, the interference fringes of the moiré which is present at that time are picked up as the initial pattern, and the information about the initial pattern is stored in the lens control. Then, interference fringes of a moiré is measured when necessary and compared with the stored initial pattern to determine the displacement of the interference fringes. This enables the detection of any variation in the projection magnification and/or any variation in the 2-dimensional distortion.

A projection exposure system according to a third embodiment of the present invention is described hereinafter. The third embodiment illustrates an application of the present invention to a step-and-scan type of scanning projection exposure system. There are many basic features common to a scanning projection exposure system and a step-and-repeat projection exposure system such as the first embodiment. In consequence, any and all features shown in FIGS. 1, 3, 4, 5 and 6 are of the first embodiment and of the third embodiment at the same time. Thus, the third embodiment will be described with reference to FIGS. 1, 3, 4, 5 and 6 as well as FIGS. 14(A) and 14(B). Further, in the following description, stress is placed on the unique features specific to a scanning projection exposure system, and the common features will not be described in detail for simplicity.

In the third embodiment, a scanning projection technique is used, in which an image of patterns formed on a reticle is projected for exposure onto one shot-field after another on a wafer through a projection optical system, while the patterns are demagnified with the magnification 4:1.

FIG. 1 shows a schematic of a projection exposure system according to the third embodiment. As shown, an illumination beam IL for exposure exiting from an illumination optical system EL is reflected by a dichroic mirror 12, which is positioned diagonally at an angle of 45 degrees relative to the plane of a reticle 1, to illuminate a rectangular illumination area IA (see FIG. 14(A)) on the reticle 1, the area IA being referred to as the "slit-shaped illumination area" hereinafter. An image of circuit patterns formed within the slit-shaped illumination area IA is projected for exposure onto the surface of a wafer 3 through a projection optical system 2. As with the first embodiment, we define the direction of the optical axis AX of the projection optical system 2 as Z-direction, the direction which is parallel with the sheet surface of this drawing and perpendicular to Z-direction as X-direction, and the direction which is perpendicular to the sheet surface as Y-direction.

While the image of the circuit patterns on the reticle 1 is projected for exposure onto the surface of the wafer, the reticle 1 and the wafer 3 are moved relative to the stationary slit-shaped illumination area IA defined by the illumination beam IL for scanning the reticle 1 and the wafer 3. Specifically, the reticle 1 is moved in the direction perpendicular to and toward the sheet surface of FIG. 1 (i.e., in (−Y)-direction) at a constant rate or velocity $V_R$, and the wafer 3 is moved in the direction perpendicular to and away from the sheet surface of FIG. 1 (i.e., in (+Y)-direction) in synchronism therewith at a constant rate or velocity $V_W=\beta \times V_R$, where $\beta$ is the magnification of the projection optical system 2 ($\beta=\frac{1}{4}$ in this embodiment).

Figure 14A:
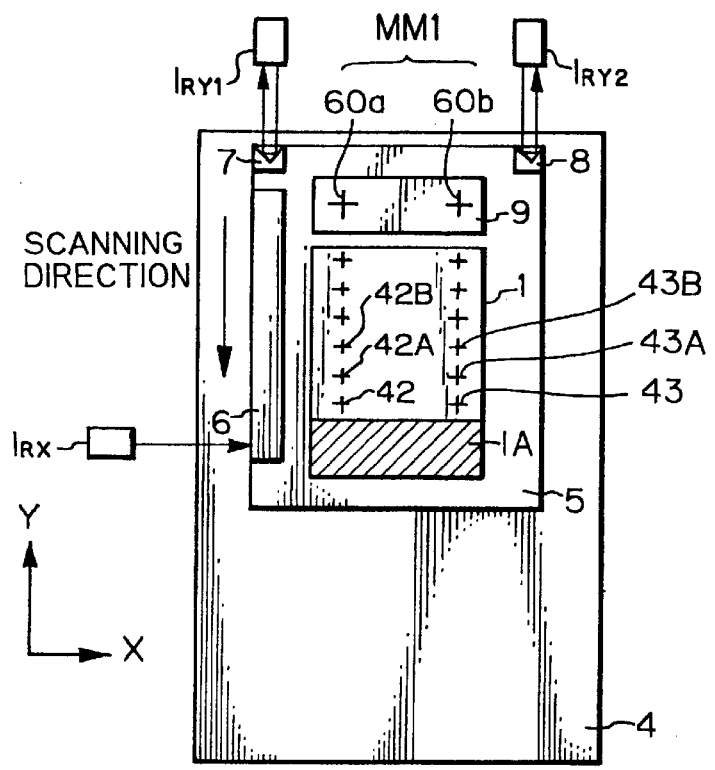
FIG. 14(A) is a plan view illustrating the positioning of a reticle stage when a slit-shaped illumination area IA is coincident with a scanning start area defined on the reticle stage.
Figure 14B:
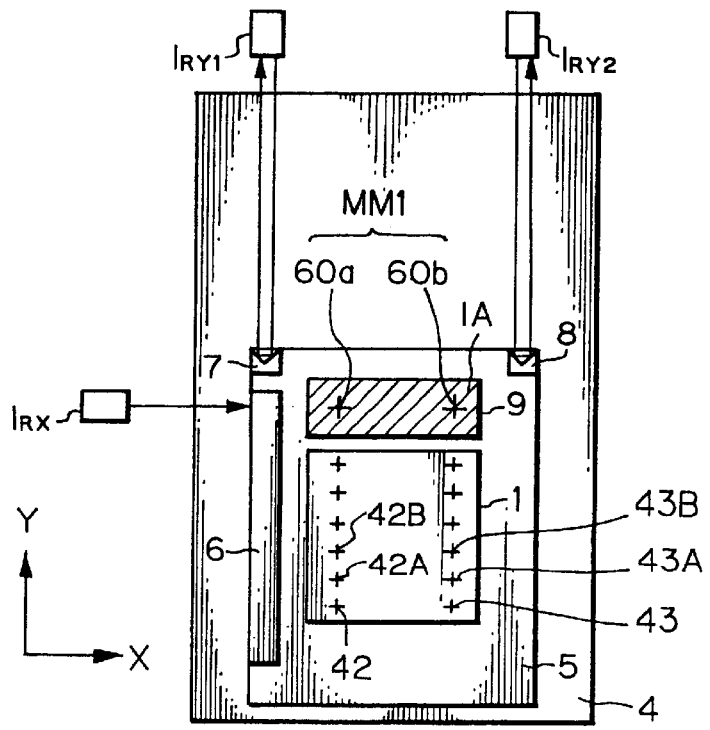
FIG. 14(B) is a plan view illustrating the positioning of the reticle stage when a first reference pattern MM1 is aligned under the slit-shaped illumination area IA.

FIGS. 14(A) and 14(B) are plan views showing an arrangement of various components around the reticle 1, which arrangement is described below in detail with reference to FIGS. 1 and 14(A), 14(B).

As shown in FIG. 1, a reticle base 4 carries a reticle stage 5 on which the reticle 1 having circuit patterns formed thereon is fixedly held by vacuum suction. The reticle stage 5 is capable of alignment of the reticle 1 in a 2-dimensional plane which is perpendicular to the optical axis AX of the projection optical system 2 (i.e., in an XY-plane), with respect to the positions of the reticle 1 in X-direction, in Y-direction, and in a rotational direction (θ-direction). Further, the reticle stage 5 is capable of scanning of the reticle 1 in Y-direction (scanning direction) at a predetermined scanning rate of velocity. That is, the reticle 1 is movable in Y-direction by a stroke sufficiently long for the entire area of the reticle 1 including the circuit patterns to pass through the slit-shaped illumination are defined by the illumination beam IL. FIGS. 14(A) and 14(B) show the reticle stage 5 positioned on the reticle base 4 at positions most to (+Y)-direction and most to (−Y)-direction, respectively.

As shown in FIGS. 1 and 14(A), the coordinates of the position of the reticle stage 5 in the 2-dimensional plane are determined by means of moving mirrors 6, 7 and 8 mounted on the reticle stage 5 and laser interferometers $I_{RX}$, $I_{RY1}$ and $I_{RY2}$ disposed around the reticle stage 5. Specifically, the reticle stage 5 is of a rectangular shape in plan and has four sides. One laser interferometer $I_{RX}$ is disposed near one of the sides of the reticle stage 5 that faces to (−X)-direction, and the corresponding one moving mirror 6 is mounted on the reticle stage 5. The moving mirror 6 has a shape elongated in Y-direction. The combination of the laser interferometer $I_{RX}$ and the moving mirror 6 is used to determine X-coordinate of the position of the reticle stage 5. The other two laser interferometers $I_{RY1}$ and $I_{RY2}$ are disposed near both ends of the side of the reticle stage 5 that faces to (+Y)-direction, and the other two moving mirrors 7 and 8 corresponding to these laser interferometers are mounted on the reticle stage 5 at positions near those ends of the reticle stage 5 (i.e., both ends of the side facing to (+Y)-direction). The moving mirrors 7 and 8 are corner-cube mirrors. The combination of the laser interferometers $I_{RY1}$, $I_{RY2}$ and the moving mirrors 7, 8 is used to determine Y-coordinate of the position of the reticle stage 5 as well as the angle of the rotational displacement of the reticle stage 5. The position of the reticle stage 5 is continuously detected by means of the laser interferometers $I_{RX}$, $I_{RY1}$ and $I_{RY2}$ with a certain resolution (for example, with a resolution of the order of 0.01 micrometer). Further, the angle of the rotational displacement of the reticle stage 5 is detected from the difference between the measurements of the laser interferometers $I_{RY1}$ and $I_{RY2}$.

As shown in FIG. 14(A), a first reference plate 9 is mounted on the reticle stage 5 at the position adjacent the reticle 1 and near one of the sides of the reticle stage 5 that faces to (+Y)-direction. The first reference plate 9 comprises a rectangular, transparent glass plate, which is described below in more detail. A second reference plate 25 is mounted on a wafer leveling table 17. The second reference plate 25 comprises a transparent glass plate, which is described below in more detail. Further, observation optical systems 10 and 11 for observing both the first and second reference plates 9 and 25 by a through-the-reticle (TTR) method are disposed above the (−X)-direction side and X-direction side of the reticle stage 5, respectively. The observation optical systems 10 and 11 each comprises an imaging device and provides mark-position-error information to be sent to a main control 100, which uses the information to derive the magnification and the distortion of the projection optical system 2 by calculation. Moreover, the main control 100 generally controls the entire projection exposure system.

FIG. 3 is a plan view showing an arrangement of a wafer stage, which is used not only in the projection exposure system according to the first embodiment but also in the projection exposure system according to the third embodiment. This arrangement is described below with reference to FIGS. 1 and 3.

A wafer Y-stage 15 is driven by an electric motor 19 through a feed screw 20 to move in Y-direction relative to a system base (not shown). The wafer Y-stage 15 is capable of scanning of the wafer 3 in Y-direction (scanning direction) at a predetermined scanning rate of velocity. A wafer X-stage 16 is driven by an electric motor 21 through a feed screw 22 to move in X-direction relative to the wafer Y-stage 15. A wafer leveling table 17 is driven by a drive unit (not shown) to swing or tilt in any directions relative to the image plane of the projector optical system 2 as well as to minutely move in the direction of the optical axis AX of the projector optical system 2 (i.e., in Z-direction). The wafer leveling table 17 is also capable of rotation about the optical axis AX.

As shown in FIG. 1, a focal point detection system is provided which comprises a light-emitting optical system 13 and a light-receiving optical system 14. The light-emitting optical system 13 projects an image of a pin-hole or a slit-pattern onto the exposure surface of the wafer 3 near the image plane of the projection optical system 2, the projection being made obliquely at a certain angle relative to the optical axis AX. The light-receiving optical system 14 receives the reflected light beam from the projected image to form again an image of the projected image. The position in Z-direction of the surface of the wafer 3 is detected by the focal point detection system comprising the optical systems 13 and 14, and the detection information is used to perform an auto-focusing operation to align the surface of the wafer 3 with the image plane of the projection optical system 2. This focal point detection method is the same one as used in a step-and-repeat projection exposure system.

Next described is an alignment optical system AL used in this embodiment and shown in FIG. 1. The alignment optical system AL in this embodiment is of a Field Image Alignment (FIA) type in which an image processing technique is used to measure any position shift between the images of a reticle mark and a wafer mark.

FIG. 5 is a schematic showing the alignment optical system AL. The construction and arrangement of the alignment system AL is the same one as used in a step-and-repeat projection exposure system and thus will not be described in detail for simplicity.

FIG. 6 schematically shows images picked up by 2-dimensional CCD imaging devices 32 and 38 and displayed on a screen of a CRT (cathode ray tube) display 39.

Next, the operations of the reticle stage and the wafer stage for the alignment operation and the exposure operation are described.

As shown in FIG. 1, a wafer 3 is transferred and loaded on the wafer holder 18 by a wafer loader (not shown) and fixedly held on the wafer holder 18 by vacuum suction. Then, the alignment of the wafer 3 is performed by a rough alignment system (not shown) so that the registration of the order of several micrometers is achieved. Then, a first set of wafer marks 40 and 41 that are associated with the first one of the shot-fields on the wafer 3 (i.e., the shot-field to be exposed first) are aligned within the view fields of the two alignment observation systems AL1 and AL2 shown in FIG. 5. For this alignment, the position of the wafer 3 is adjusted by the wafer X-stage 16 and the wafer Y-stage 15 under the control based on the values measured by the laser interferometers $I_{WX}$, $I_{WY1}$ and $I_{WY2}$. At the same time, first reticle marks 42 and 43 are aligned within the view fields of the two alignment observation systems AL1 and AL2 by moving the reticle stage 5. The reticle marks 42 and 43 are shown in FIG. 1 as if their positions in X-direction are beyond the X-direction boundaries of the illumination area IA for clear visual discrimination, however, their positions in X-direction are in fact within the X-direction boundaries of the illumination area IA as shown in FIGS. 14(A) and 14(B).

Then, one alignment observation system AL1 determines the relative position shift ($\Delta xa_1$, $\Delta ya_1$) between the positions of the reticle mark 42 and the wafer mark 40, while the other alignment observation system AL2 determines the relative position shift ($\Delta xa_2$, $\Delta ya_2$) between the positions of the reticle mark 43 and the wafer mark 41, where $\Delta xa_1$ and $\Delta xa_2$ represent position shift components in X-direction, and $\Delta ya_1$ and $\Delta ya_2$ represent position shift components in Y-direction. Then, the reticle stage 5 is minutely moved in an attempt to reduce all of these position shift components to zero (or to values less than a predetermined reference value). The alignment is thus achieved by the same procedures as taken in the step-and-repeat projection technique. However, the exposure operation performed in the scanning projection exposure system differs from that of the step-and-scan type of the projection exposure system. Specifically, once the alignment is achieved, the scanning projection exposure operation is started by moving the reticle stage 5 and the wafer Y-stage 15 in the opposite directions along the Y-direction (i.e., in (+Y)- and (−Y)-directions and vice versa) at velocities which are in ratio 4:1, while they are illuminated by the illumination light beam for exposure. Subsequently, successive alignment operations are performed during the scanning exposure operation, in which the reticle stage 5 is minutely moved in an attempt to reduce any position shifts between a second set of reticle marks 42A, 43A and the corresponding second set of wafer marks, those between a third set of reticle marks 42B, 43B and the corresponding third set of wafer marks, and so on, to zero (or to values less than a predetermined reference value).

Referring next to FIGS. 3, 4 and 14, it is described how to detect any variation in the magnification and other factors of the projection optical system used in the scanning projection exposure system of the third embodiment.

FIGS. 14(A) and 14(B) show an arrangement of various components on and around the reticle stage 5 as previously mentioned, and in particular, FIG. 14(A) illustrates the positioning of the reticle stage 5 when the slit-shaped illumination area IA is coincident with a scanning start area defined on the reticle stage 5, while FIG. 14(B) illustrates the positioning of the reticle stage 5 when a first reference pattern MM1 is aligned under the slit-shaped illumination area IA.

As shown in FIGS. 3 and 14(A) and 14(B), the elongate, transparent first reference plate 9 mounted on the reticle stage 5 and extending in X-direction has a first reference pattern MM1 formed thereon. The first reference pattern MM1 comprises two cross-marks 60a and 60b formed at positions near both ends of the first reference plate 9. The elongate second reference plate 25 mounted on the wafer leveling table 17 and extending in X-direction has a second reference pattern WM1 formed thereon. The second reference pattern WM1 comprises two cross-marks 61a and 61b formed at positions near both ends of the second reference plate 25. The second reference pattern WM1 has a shape which corresponds to the shape of the first reference pattern MM1 inverted and demagnified with the magnification substantially equal to the magnification β of the projection optical system 2.

Each of the first and second reference patterns MM1 and WM1 is of a size sufficiently compact so that it may be encompassed within the slit-shaped illumination area IA.

For convenience, FIG. 3 illustrates the second reference pattern WM1 by the appearance of the projected image thereof that is projected onto the reticle stage 5 through the projection optical system 2. In every embodiment described here, the second reference pattern is designed to have its actual size equal to the size of the first reference pattern demagnified with the magnification substantially equal to the magnification β of the projection optical system 2. Further, in the drawings, either the first reference pattern of the second reference pattern is illustrated by the appearance of the projected image thereof that is projected onto the wafer leveling table 17 or reticle stage 5, respectively, through the projection optical system 2.

For detecting any variation in the magnification, in the first place, the first reference plate 9 mounted on the reticle stage 5 is aligned under the illumination area IA of the exposure light beam. At the same time, the second reference plate 25 mounted on the wafer leveling table 17 is aligned under an exposure area conjugate to the illumination area IA. For this alignment, the reticle stage 5 is moved so as to move the first reference plate 9 into the illumination area IA as shown in FIGS. 14(A) and 14(B), while the wafer X-stage 16 and the wafer Y-stage 15 are moved so as to move the second reference plate 25 into the exposure area conjugate to the illumination area IA. Then, the first reference pattern MM1 on the first reference plate 9 and the second reference pattern WM1 on the second reference plate 25 are observed through the observation optical systems 10 and 11. Although what is actually observed through the observation optical systems is not the second reference pattern WM1 but the projected image thereof that is projected on the reticle stage 5 through the projection optical system 2, we simply express it as "the second reference pattern WM1 is observed" for simplicity of the description. Such expression may be used as well in the description relating to the observed image hereinafter.

FIG. 4 shows images which may be observed through the observation optical systems 10 and 11. The observations are used in the same manner as they are used in the step-and-repeat projection exposure system according to the first embodiment to obtain the information about the variation in the projection magnification. The information thus obtained is sent to the lens control, and thereby any error in the projection magnification can be quickly corrected by moving movable lens groups of the projection optical system 2 through the associated drive unit (not shown). The correction of the projection magnification may be performed according to the above procedures in any of suitable waiting time of the exposure system. It may be generally preferable to perform the calibration for the correction once an hour or once a day. In particular, in the scanning projection exposure system, the correction of the magnification in the direction transverse to the scanning direction may be performed in the same manner as the step-and-repeat projection exposure system, while the correction of the magnification in the scanning direction may be performed by adjusting the ratio between the velocities of the motions of the reticle 1 and the wafer 3 for scanning.

As clearly understood from the above, in the scanning projection exposure system according to the third embodiment of the present invention, as with the step-and-repeat projection exposure system, the superimposed images of the first reference pattern on the reticle stage 5 and the second reference pattern on the wafer leveling table 17 are observed through the observation optical systems 10 and 11 so as to obtain the difference between the relative position shifts at two positions spaced apart from each other in X-direction, and any variation in the projection magnification is easily derived from the value of the difference by calculation. By virtue of this, any variation in the projection magnification can be quickly detected and the correction of the magnification for any variation can be performed quickly as well.

FIGS. 10(A)–10(C), 11(A)–11(C) and 15(A)–15(C) show three alternative examples of first and second reference patterns which may be formed on the first and second reference plates used in the scanning projection exposure system according to the third embodiment. Like elements and components shown in FIGS. 10(A)–10(C) to 12 and 15(A)–15(C) are designated by the same reference numerals as used in FIGS. 3 and 14(A), 14(B).

Two of the three alternative examples shown in FIGS. 10(A)–10(C) and 11(A)–11(C), respectively, have been described above in relation to the previous embodiments, and thus will not be described again to avoid redundancy.

Figure 15A:
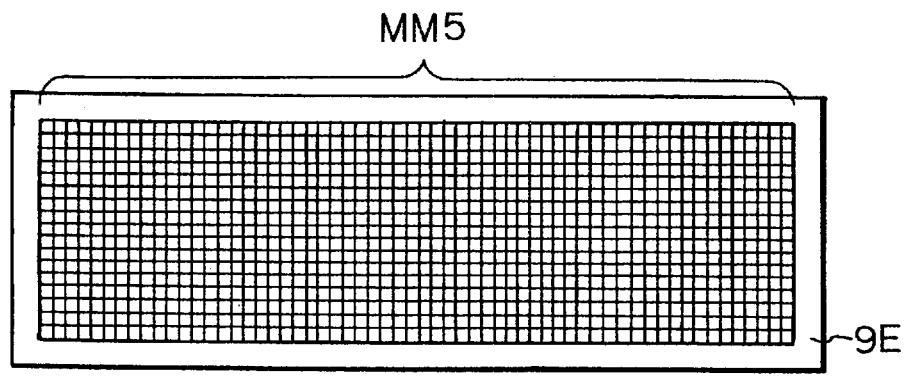
FIGS. 15(A) to 15(C) are plan views showing an alternative example of first and second reference patterns for use in a scanning projection exposure system of the present invention.
Figure 15B:
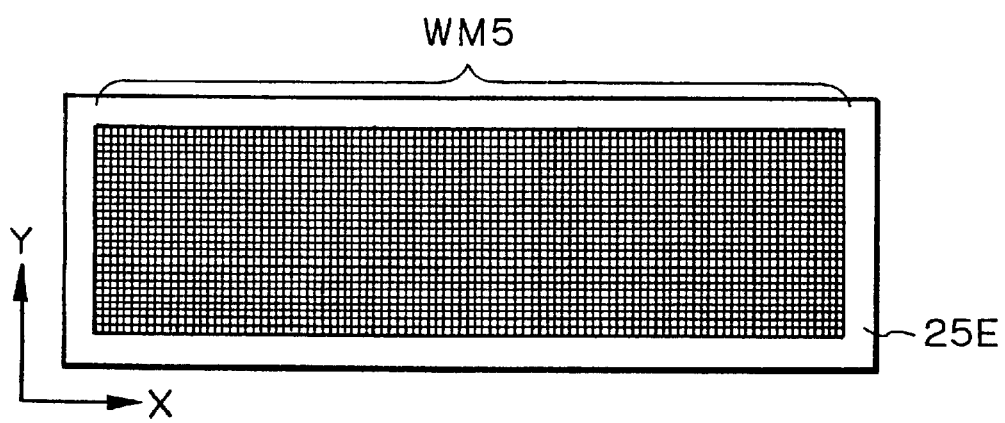
Figure 15C:
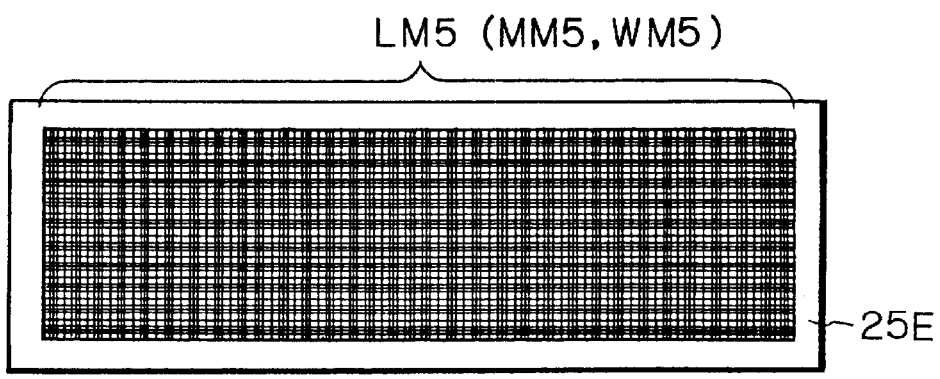

FIGS. 15(A) to 15(C) are plan views showing the third of the alternative examples of first and second reference patterns. In this example, each reference pattern comprises a 2-dimensional grating pattern. Specifically, FIG. 15(A) shows a first reference pattern MM5, which is formed on a first reference plate 9E and comprises a 2-dimensional grating having both X-direction pitch and Y-direction pitch equal to a first pitch 4P5 (this designation "4P5" implies 4 (four) times a pitch P5 of a demagnified image of the first reference pattern described below). FIG. 15(B) shows a second reference pattern WM5, which is formed on a second reference plate 25E and comprises a 2-dimensional grating having a second pitch P6 which is nearly equal to and slightly different from the pitch P5 of the demagnified image of the first reference pattern. The demagnified image of the first reference pattern MM5 is reduced with the magnification 4:1.

When observing through an imaging device the superimposed projected images of these two 2-dimensional gratings having pitches slightly different from each other, we see a moiré which comprises interference fringes LM5 having both X-direction pitch and Y-direction pitch equal to (P5× P6)/(P5−P6), like a moiré resulting from the superimposition of the two 1-dimensional gratings shown in FIGS. 11(A) to 11(C). The interference fringes have an appearance of a 2-dimensional grating pattern having these new X- and Y-direction pitches, resulting from the superimposition of the images of the first reference pattern MM5 and the second reference pattern WM5.

FIG. 15(C) shows the 2-dimensional interference fringes LM5 of a moiré which may be observed through the imaging device. The interference fringes LM5 will displace in X-direction when the image of the 2-dimensional grating of the first reference pattern MM5 and/or the image of the 2-dimensional grating of the second reference pattern WM5 displaces in X-direction, like interference fringes resulting from the superimposition of the 1-dimensional gratings described above, according to the relationships expressed by the following equations (12) and (13).

$$\Delta M_{X5}=\Delta t_{X5}(P5/(P5-P6)) \qquad (12)$$

$$\Delta M_{X6}=\Delta t_{X6}(P6/(P5-P6)) \qquad (13)$$

where:

$\Delta M_{X5}$ is the X-direction displacement of the interference fringes LM5 of the moiré caused by the X-direction displacement of the image of the 2-dimensional grating of the first reference pattern MM5;

$\Delta t_{X5}$ is the X-direction displacement of the image of the 2-dimensional grating of the first reference pattern MM5;

$\Delta M_{X6}$ is the X-direction displacement of the interference fringes LM5 of the moiré caused by the X-direction displacement of the image of the 2-dimensional grating of the second reference pattern WM5; and $\Delta t_{X6}$ is the X-direction displacement of the image of the 2-dimensional grating of the second reference pattern WM5.

Moreover, by using the 2-dimensional gratings of this example for the first and second reference patterns, not only the displacement in X-direction but also the displacement in Y-direction can be detected. Specifically, the interference fringes LM5 will displace in Y-direction when the image of the 2-dimensional grating of the first reference pattern MM5 and/or the image of the 2-dimensional grating of the second reference pattern WM5 displaces in Y-direction, according to the relationships expressed by the following equations (14) and (15).

$$\Delta M_{Y5}=\Delta t_{Y5}(P5/(P5-P6)) \qquad (14)$$

$$\Delta M_{Y6}=\Delta t_{Y6}(P6/(P5-P6)) \qquad (15)$$

where:

$\Delta M_{Y5}$ is the Y-direction displacement of the interference fringes LM5 of the moiré caused by the Y-direction displacement of the image of the 2-dimensional grating of the first reference pattern MM5;

$\Delta t_{Y5}$ is the Y-direction displacement of the image of the 2-dimensional grating of the first reference pattern MM5;

$\Delta M_{Y6}$ is the Y-direction displacement of the interference fringes LM5 of the moiré caused by the Y-direction displacement of the image of the 2-dimensional grating of the second reference pattern WM5; and $\Delta t_{Y6}$ is the Y-direction displacement of the image of the 2-dimensional grating of the second reference pattern WM5.

The imaging device for observing and detecting the displacements of the interference fringes of the moiré in X- and Y-directions may comprise an imaging device which has a substantially rectangular imaging surface and disposed directly below the second reference plate 25E. Again, in the course of an initial adjustment of the scanning projection exposure system, the interference fringes of the moiré which is present at that time are picked up as the initial pattern, and the information about the initial pattern is stored in the lens control. Then, interference fringes of a moiré is measured when necessary and compared with the stored initial pattern to determine the displacement of the interference fringes. This enables the detection of any variation in the projection magnification and/or any variation in the 2-dimensional distortion.

When this example of first and second reference patterns are used to find that there are magnification errors in both X- and Y-direction (scanning direction) and they are different from each other, the respective magnification in X- and Y-directions of the projection optical system 2 should be separately adjusted to be β (=¼) if possible. However, if the separate adjustment of the magnification in these directions is not possible, then the magnification in X-direction may be adjusted with the first priority, and the ratio between the scanning rates or velocities of the reticle 1 and the wafer 3 may be adjusted to be β upon the scanning projection operation. This ensures that an image of the patterns formed on the reticle 1 will be demagnified and projected onto an entire shot-field on the wafer 3 with both the magnification in X- and Y-direction being exactly equal to β.

The first and third embodiments described above illustrate the applications of the present invention to a step-and-repeat projection exposure system and a step-and-scan type of scanning projection exposure system, respectively. However, the application of the present invention is not limited to these types of projection exposure systems. For example, the present invention is also applicable to slit-scan type of scanning projection exposure systems.

Although certain preferred embodiments of the present invention have been shown and described in detail, it should be understood that various changes and modifications may be made therein and the present invention may be embodied in various other forms without departing from the spirit and the scope of the present invention.

What is claimed is:

1. An exposure method in which an image of a pattern formed on a first object is projected onto a second object to expose the second object and in which positional information on the first object in a predetermined direction is measured during exposure for the second object, the method comprising:
    detecting a first reference mark which is arranged on a first movable member used for holding the first object and which is apart from the first object; and
    performing an operation using information obtained by detecting the first reference mark.

2. A method according to claim 1, wherein the operation includes calculation of an image-formation characteristic.

3. A method according to claim 2, wherein the image-formation characteristic includes distortion.

4. A method according to claim 2, wherein the image-formation characteristic includes magnification.

5. A method according to claim 1, wherein the operation includes adjustment of a projection system for projecting the image of the pattern on the first object onto the second object.

6. A method according to claim 5, wherein the projection system includes a movable optical element for the adjustment of the projection system.

7. A method according to claim 1, wherein the first object and the second object are synchronously moved to expose the second object, the first object being moved in the predetermined direction.

8. A method according to claim 7, wherein the operation includes adjustment of the ratio between the velocities of the first object and the second object during the synchronous movement.

9. A method according to claim 1, wherein the first reference mark includes a plurality of reference marks spaced apart from each other in the predetermined direction.

10. A method according to claim 1, wherein the first reference mark includes a plurality of reference marks spaced apart from each other in a direction transverse to the predetermined direction.

11. A method according to claim 9, wherein the first movable member is moved in the predetermined direction to detect the plurality of reference marks.

12. A method according to claim 1, wherein the first reference mark includes a grating mark.

13. A method according to claim 1, wherein for detecting the first reference mark, the first reference mark is disposed within an irradiation area of an exposure beam used to expose the second object.

14. A method according to claim 1, wherein the positional information on the first object in the predetermined direction is measured by using an interferometer.

15. A method according to claim 14, wherein the first movable member includes a reflective member,
    wherein the interferometer irradiates the reflective member with a measuring beam to measure the positional information on the first object,
    and wherein the first reference mark is disposed between the reflective member and the first object.

16. A method according to claim 1, wherein the first reference mark is detected while exchanging, the second object for another one.

17. A method according to claim 1, wherein the first reference mark is detected through a projection system for projecting the image of the pattern on the first object onto the second object.

18. A method according to claim 1, wherein the first reference mark is detected together with a second reference mark which is arranged on an image plane side of a projection system for projecting the image of the pattern on the first object onto the second object.

19. A method according to claim 18, wherein the second reference mark is arranged on a second movable member which holds the second object.

20. A method for producing a device by the method of claim 1.

21. A method for producing a device by an exposure method in which an image of a pattern formed on a first object is projected onto a second object to expose the second object and in which positional information on the first object in a predetermined direction is measured during exposure for the second object, the exposure method comprising:
    detecting a first reference mark which is arranged on a first movable member used for holding the first object and which is apart from the first object; and
    performing an operation using information obtained by detecting the first reference mark.

* * * * *